US011251096B2

(12) United States Patent
Mirin et al.

(10) Patent No.: US 11,251,096 B2
(45) Date of Patent: Feb. 15, 2022

(54) WAFER REGISTRATION AND OVERLAY MEASUREMENT SYSTEMS AND RELATED METHODS

(71) Applicant: Micron Technology, Inc., Boise, ID (US)

(72) Inventors: Nikolay A. Mirin, Boise, ID (US); Robert Dembi, Boise, ID (US); Richard T. Housley, Boise, ID (US); Xiaosong Zhang, Boise, ID (US); Jonathan D. Harms, Meridian, ID (US); Stephen J. Kramer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/122,106

(22) Filed: Sep. 5, 2018

(65) Prior Publication Data

US 2020/0075432 A1 Mar. 5, 2020

(51) Int. Cl.
*G03F 7/20* (2006.01)
*H01L 21/68* (2006.01)
(Continued)

(52) U.S. Cl.
CPC ............ *H01L 22/12* (2013.01); *H01L 21/302* (2013.01); *H01L 21/682* (2013.01); *H01L 23/544* (2013.01); *H01L 2223/54426* (2013.01)

(58) Field of Classification Search
CPC ....... B24B 49/105; H01L 22/14; H01L 22/26; H01L 23/544; H01L 2224/10135
See application file for complete search history.

(56) References Cited

U.S. PATENT DOCUMENTS 4,072,200 A 2/1978 Morris et al.
4,933,640 A 6/1990 Kuckes
(Continued)

FOREIGN PATENT DOCUMENTS

CN 1991586 A 3/2012
CN 202189227 U 4/2012
(Continued)

OTHER PUBLICATIONS

Wikipedia, Photolithography, https://en.wikipedia.org/wiki/Photolithography, visited Jun. 4, 2018, 10 pages.
(Continued)

*Primary Examiner* — Bradley Smith
*Assistant Examiner* — David J Goodwin
(74) *Attorney, Agent, or Firm* — TraskBritt

(57) ABSTRACT

A method for measuring overlay between an interest level and a reference level of a wafer includes applying a magnetic field to a wafer, detecting at least one residual magnetic field emitted from at least one registration marker of a first set of registration markers within the wafer, responsive to the detected one or more residual magnetic fields, determining a location of the at least one registration marker of the first set registration markers, determining a location of at least one registration marker of a second set of registration markers, and responsive to the respective determined locations of the at least one registration marker of the first set of registration markers and the at least one registration marker of the second set of registration markers, calculating a positional offset between an interest level of the wafer and a reference level of the wafer. Related methods and systems are also disclosed.

22 Claims, 13 Drawing Sheets

100
102
103
CONTROLLER 118
PROCESSOR 120
MEMORY 122
INPUT/OUTPUT 124
104
109
108
132
110
114
112
130

(51) Int. Cl.
*H01L 21/66* (2006.01)
*H01L 23/544* (2006.01)
*H01L 21/302* (2006.01)

(56) References Cited

U.S. PATENT DOCUMENTS 6,049,974 A * 4/2000 Asanasavest ........... H01L 21/68 29/832
6,068,954 A 5/2000 David
6,778,275 B2 8/2004 Bowes
6,779,171 B2 8/2004 Baggenstoss
6,822,342 B2 11/2004 Baluswamy et al.
7,046,001 B2 * 5/2006 Tada ..................... B24B 37/013 324/226
7,112,960 B2 * 9/2006 Miller ................... B24B 37/013 324/230
7,181,057 B2 2/2007 Ghinovker et al.
7,463,367 B2 12/2008 Bowes
8,313,877 B2 11/2012 Chung
8,400,634 B2 3/2013 Zhou et al.
8,408,965 B2 * 4/2013 Bennett ................. B24B 37/013 340/680
9,023,667 B2 * 5/2015 Iravani .................... H01L 22/14 438/10
9,748,128 B1 8/2017 Chao et al.
10,217,637 B1 2/2019 Budd et al.
11,009,798 B2 * 5/2021 Mirin .................... H01L 23/544
2002/0054703 A1 5/2002 Hiroi et al.
2002/0062992 A1 5/2002 Fredericks et al.
2004/0165195 A1 * 8/2004 Sato ...................... G03F 9/7088 356/614
2005/0072528 A1 * 4/2005 Owczarz ................. B24B 1/005 156/345.16
2006/0145690 A1 7/2006 Shoji
2009/0170024 A1 * 7/2009 Hennig ............... G03F 7/70958 430/270.1
2010/0114522 A1 5/2010 Chung
2011/0299054 A1 12/2011 Van De Rijdt et al.
2012/0049839 A1 3/2012 Kiendl
2012/0313236 A1 12/2012 Wakiyama et al.
2016/0139221 A1 5/2016 Overweg
2016/0170317 A1 6/2016 Li et al.
2017/0213864 A1 7/2017 Chen et al.
2017/0278783 A1 * 9/2017 Agrawal ................. H01L 24/16
2018/0114756 A1 4/2018 Zhang et al.
2018/0122669 A1 5/2018 Wu et al.
2018/0136570 A1 5/2018 Zeng et al.
2018/0138396 A1 * 5/2018 Nagel ..................... H01L 43/12
2019/0035699 A1 * 1/2019 Lu ........................... H01L 22/14

FOREIGN PATENT DOCUMENTS

CN 106463380 A 10/2019
EP 3316039 A2 5/2018

OTHER PUBLICATIONS

Seidel et al., In-Die Photomask Registration and Overlay Metrology with PROVE <R> Using 2D Correlation Methods, Proc. of SPIE, vol. 8166, (2011), 8166E-1-81661E-13.
Petruska et al., Optimal Permanent-Magnet Geometries for Dipole Field Approximation, IEEE Transactions on Magnetics, vol. 49, Issue 2, (Feb. 2013), pp. 811-819.
KLA Tencor, Metrology, https://www.kla-tencor.com/products/chip-manufacturing/metrology.html, visited May 24, 2018, 12 pages.
Hawkins, Aaron R., Contact Photolithographic Alignment Tutorial, Electrical and Computer Engineering Department, Brigham Young University, (Jan. 2004), 9 pages.
Cheung, N., EE143 Microfabrication Technologies Fall 2010 Lecture Notes, Nov. 4, 2010, http://www-inst.eecs.berkeley.edu/~ee143/fa10/lectures/Lec_20.pdf, 21 pages.
Chinese Notice of Allowance for Application No. 201910837865.6, dated May 27, 2021, 8 pages.

* cited by examiner

WAFER REGISTRATION AND OVERLAY MEASUREMENT SYSTEMS AND RELATED METHODS

CROSS-REFERENCE TO RELATED APPLICATION

The present application is related to U.S. patent application Ser. No. 16/122,062, filed Sep. 5, 2018, pending, the entire disclosure of which is hereby incorporated herein by this reference.

TECHNICAL FIELD

This disclosure relates generally to wafer registration and overlay measurement systems and methods of achieving overlay measurements. More specifically, overlay measurements may be conducted using visible registration markers in conjunction with ferromagnetic or antiferromagnetic registration markers. Registration markers exhibiting active responses to external magnetic stimuli may also be employed.

BACKGROUND

A photolithography apparatus is a machine that applies a desired pattern onto a substrate, usually onto a target portion of a bulk semiconductor substrate such as a semiconductor wafer. Photolithography apparatus can be used, for example, in the fabrication of semiconductor devices. In that instance, a patterning device, which is referred to in the art as a mask or a reticle, may be used to generate circuit patterns to be formed on die locations from an individual material level on an active surface of the wafer. This pattern can be transferred onto a target portion (e.g., including part of, one, or several die locations) on the wafer (e.g., a silicon wafer). Transfer of the pattern is typically effected via imaging onto a layer of radiation-sensitive material (i.e., photoresist) provided on the wafer. In general, a wafer will contain a grid of adjacent target portions corresponding to die locations that are successively patterned. In lithographic processes, it is often desirable to frequently make measurements of the features (i.e., structures) created and locations thereof on the wafer, e.g., for process control and verification. Various tools for making such measurements are known, including scanning electron microscopes, which are often used to measure critical dimension (CD), and tools to measure overlay, a measure of the accuracy of alignment of two layers in a semiconductor device. Overlay may be described in terms of the degree of misalignment between the two layers, for example reference to a measured overlay of 1 nm may describe a situation where two layers are laterally misaligned by 1 nm. Conventional optical methods of measuring overlay typically include using an optical microscope and measuring an optical spectrum and/or a diffraction pattern. Additional conventional optical methods of measuring overlay typically include measuring overlay with captured images from an optical microscope.

Various forms of scatterometers have been developed for use in the lithographic field. These devices are configured to direct a beam of radiation onto a target and measure one or more properties of the scattered radiation (e.g., intensity at a single angle of reflection as a function of wavelength; intensity at one or more wavelengths as a function of reflected angle; or polarization as a function of reflected angle) to obtain a "spectrum" from which a property of interest of the target can be determined. Determination of the property of interest may be performed by various techniques. Some conventional techniques include reconstruction of a target by iterative approaches such as rigorous coupled wave analysis or finite element methods; library searches; and principal component analysis.

BRIEF DESCRIPTION OF THE DRAWINGS

For a detailed understanding of the present disclosure, reference should be made to the following detailed description, taken in conjunction with the accompanying drawings, in which like elements have generally been designated with like numerals, and wherein.

DETAILED DESCRIPTION

Figure 1:
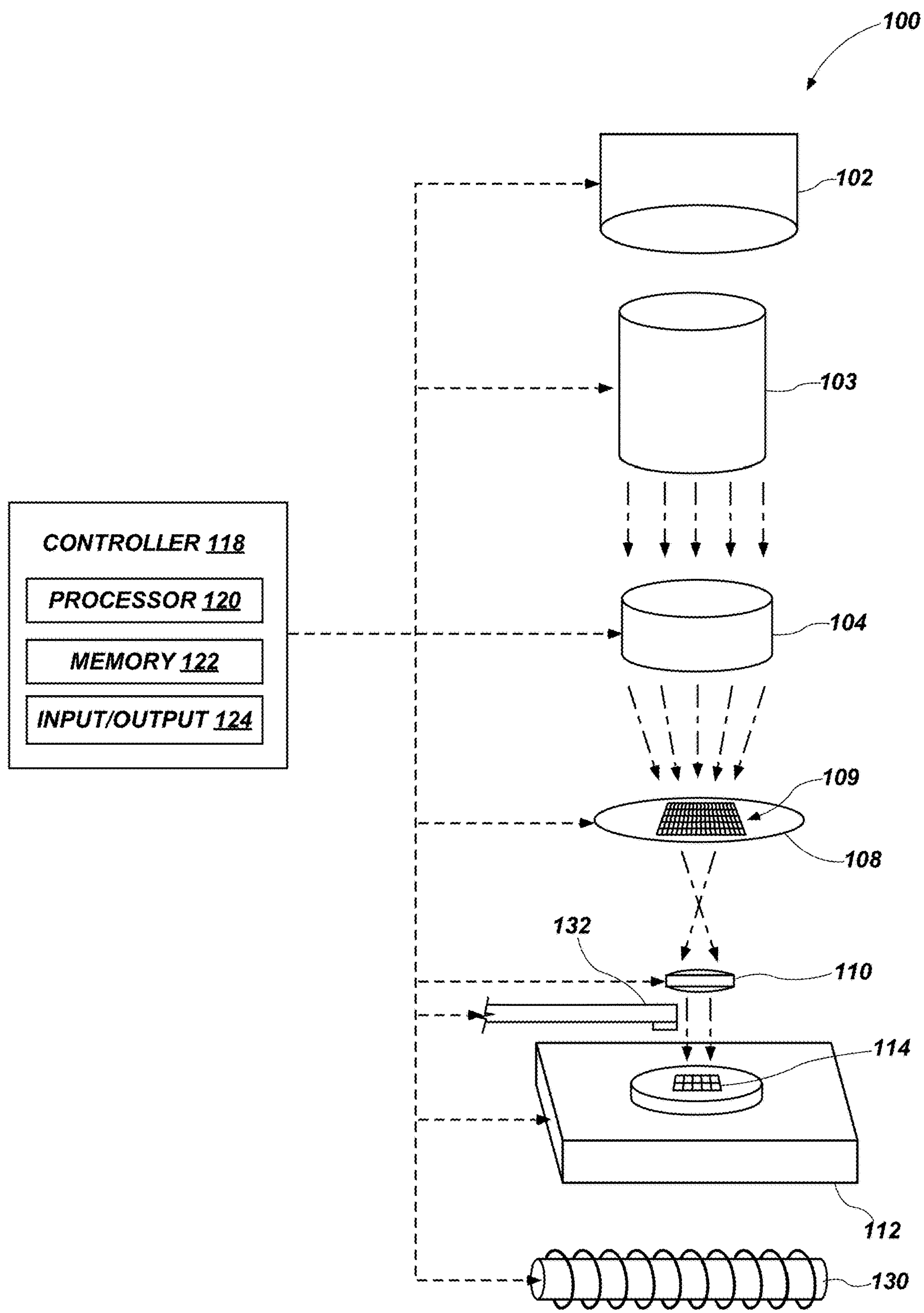
FIG. 1 illustrates a schematic diagram of a registration system according to one or more embodiments of the present disclosure.

The illustrations presented herein are not actual views of any registration system or any component thereof, but are merely idealized representations, which are employed to describe embodiments of the present invention.

As used herein, the singular forms following "a," "an," and "the" are intended to include the plural forms as well, unless the context clearly indicates otherwise.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, any relational term, such as "first," "second," "above," "upper," etc., is used for clarity and convenience in understanding the disclosure and accompanying drawings, and does not connote or depend on any specific preference or order, except where the context clearly indicates otherwise. For example, these terms may refer to orientations of elements of a registration system and/or wafer vice in conventional orientations. Furthermore, these terms may refer to orientations of elements of a registration system and/or wafer as illustrated in the drawings.

As used herein, the term "substantially" in reference to a given parameter, property, or condition means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" used in reference to a given parameter is inclusive of the stated value and has the meaning dictated by the context (e.g., it includes the degree of error associated with measurement of the given parameter, as well as variations resulting from manufacturing tolerances, etc.).

As used herein, the term "wafer" means and includes materials upon which and in which structures including feature dimensions of micrometer and nanometer scale are partially or completely fabricated. Such materials include conventional semiconductor (e.g., silicon) wafers, as well as bulk substrates of other semiconductor materials as well as other materials. For the sake of convenience, such materials will be referenced below as "wafers." Example structures formed on such materials may include, for example, integrated circuitry (active and passive), MEMS devices, and combinations thereof.

Many details of certain embodiments are described below with reference to semiconductor devices. The term "semiconductor device" is used throughout to include a variety of articles of manufacture, including, for example, individual integrated circuit dies, imager dies, sensor dies, and/or dies having other semiconductor features. Embodiments of the apparatus and processes described below may be used to measure overlay between level of materials comprising components of integrated circuitry on a wafer and, thus of an individual die or dice to be singulated from the wafer. The wafer (e.g., semiconductor device forms) may be unsingulated silicon comprising die locations, or a carrier wafer repopulated with previously singulated dice. The repopulated carrier wafer can include an adhesive molding material (e.g., a flexible adhesive), which is surrounded by a generally rigid frame having a perimeter shape comparable to that of device wafer, and laterally separated singulated elements (e.g., dies) surrounded by the molding material.

Some embodiments of the present disclosure include registration systems configured for determining an overlay measurement (e.g., measuring overlay) between an interest level of a wafer and a reference level of the semiconductor device substrate, such as a wafer or other bulk substrate comprising semiconductor material. For example, in some embodiments the registration systems may be configured to detect and locate a first set of registration markers within a reference level of the semiconductor device with ferromagnetic or anti-ferromagnetic materials or any other material or structure capable of interacting with a magnetic field. The first set of registration markers may also be characterized as non-visible elements of a wafer, as being detectable even when obscured by overlying levels of material. Additionally, the registration systems may be configured to optically detect and locate a second set of registration markers on an interest level of the wafer. In some embodiments, the second set of registration markers includes markers conventionally detectable via optical microscope imaging or scatterometry systems. The second set of registration markers may thus also be characterized as visible elements of a wafer. The registration systems may be configured to apply a magnetic field to the wafer to magnetize the first set of registration markers, or may be configured without such capability and a wafer including previously magnetized registration markers may be employed. Moreover, the registration systems may detect one or more residual magnetic fields from, magnetizations of, or signals from at least one marker of the first set of registration markers within the wafer, and responsive to the detected one or more residual magnetic fields, magnetization, or signals, the registration systems may determine a location of the at least one registration marker of the first set of registration markers. Additionally, the registration systems may visually determine a location of at least one registration marker of the second set of registration markers via an optical microscope imaging or scatterometry system. Furthermore, based on the determined locations of the at least one registration marker of the first set of registration markers and the at least one registration marker of the second set of registration markers, the registration systems may determine calculate a positional offset (e.g., and overlay measurement) between the interest level and the reference level of the semiconductor device.

FIG. 1 is a schematic view of a registration system 100 according to one or more embodiments of the present disclosure. As shown the registration system 100 may be configured as a photolithography system with additional components as described herein, although the disclosure is not so limited. The registration system 100 can be used to align semiconductor devices, determine overlay measurements of a wafer and perform registration (e.g., alignment) operations on an in-process semiconductor wafer with respect to processing tools, and if configured for an additional function, for example photolithographic exposure of a material through a reticle, perform processes for semiconductor fabrication on the wafer. Thus it will be appreciated that the present technology is not limited to registration systems per se, but is also applicable to semiconductor processing tools that require accurate overlay measurements of wafers. As a non-limiting example, the present technology can also be used for proper alignment in laser cutting and drilling tools, saws, 3-D printing tools, and other processes that necessitate overlay measurement between various materials (e.g., levels) of in-process wafers. For purposes of illustration, the registration system 100 includes an optical microscope imaging or scatterometry system including an image sensor 102, an illumination source 103, a condenser lens 104, a reticle 108, an objective lens 110, and a substrate support 112 arranged in series. As noted, some of the foregoing components enable registration system 100 to perform processing acts. Additionally, the registration system 100 includes an additional sensor 132 (referred to herein as "response sensor 132") and a magnetic source 130.

As shown in FIG. 1, a controller 118 may be operatively coupled to the image sensor 102, the illumination source 103, the condenser lens 104, the reticle 108, the objective lens 110, the substrate (e.g., wafer) support 112, the response sensor 132, and the magnetic source 130 of the registration system 100 for monitoring or controlling the operation of these components. Although not shown in FIG. 1, the registration system 100 may also include a substrate transport station, structural supports (e.g., a reticle support, a lens support, etc.), position sensors (e.g., a scatterometer), an immersion hood, a support actuator (e.g., an electric motor), and/or other suitable mechanical and/or electrical components. In general, the controller 118 may be configured to control movement of a wafer and/or components of the registration system 100 before, during, and/or after a semiconductor fabrication process. For example, a wafer 114 can undergo photoresist deposition, patterning via a light source and reticle, developing, baking, cleaning, and/or other suitable processing, and the registration system 100 may be used to align the wafer 114 and/or tools or other components associated with the registration system 100 before, during, and/or after these processes.

The controller 118 may include a processor 120 coupled to a memory 122 and an input/output component 124. The processor 120 may include a microprocessor, a field-programmable gate array, and/or other suitable logic devices. The memory 122 may include volatile and/or nonvolatile media (e.g., ROM, RAM, magnetic disk storage media, optical storage media, flash memory devices, and/or other suitable storage media) and/or other types of computer-readable storage media configured to store data. The memory 122 may store algorithms for alignment, edge detection, processing data related to detected magnetic fields and detected magnetizations, emitting magnetic fields, filters, and shape recognition for execution by the processor 120. In some embodiments, the processor 120 may be configured to send data to a computing device operatively coupled (e.g., over the Internet) to the controller 118, such as a server or personal computer. The input/output component 124 may include a display, a touch screen, a keyboard, a mouse, and/or other suitable types of input/output devices configured to accept input from and provide output to an operator.

In some embodiments, the registration system 100 may utilize the image sensor 102 to capture light reflected from a wafer and send the captured image data to the controller 118, where it is stored in the memory 122, processed by the processor 120, and/or sent to the input/output component 124. In some embodiments, the image sensor 102 may be configured to capture radiation that is not in the visible spectrum, such as UV light or infrared radiation. Alternatively, the image sensor 102 may be configured to capture imaging data of a wafer in both the visible and nonvisible radiation spectrums and send this imaging data to the controller 118. Although not shown in FIG. 1, the image sensor 102 may include a lens, aperture, image sensing component, digital signal processor, and analog or digital output. Although the image sensor 102 is shown above the illumination source 103 in FIG. 1, in some embodiments the image sensor 102 can be spaced laterally apart from the substrate support 112, and a mirror can be positioned to reflect light representative of the wafer surface topography into the image sensor 102.

Also shown in FIG. 1, the illumination source 103 may include an ultraviolet light source (e.g., a fluorescent lamp), a laser source (e.g., an argon fluoride excimer laser), and/or other suitable electromagnetic radiation emission sources. In certain embodiments, the illumination source 103 may be configured to produce generally coherent illumination at a single frequency. In other embodiments, the illumination source 103 may also be at least partially incoherent. In further embodiments, the illumination source 103 may also be configured to generate illumination at multiple frequencies.

The condenser lens 104 and the reticle 108 may be used to project a pattern of radiation onto the wafer 114. The reticle 108, for example, can include an opaque plate with lines, apertures, and/or transparencies that allow the radiation from the illumination source 103 to pass through in a defined aperture pattern 109. Below the reticle 108, the objective lens 110 can be configured to project the illumination from the reticle 108 onto a photoresist of the wafer 114. For example, the registration system 100 may include the optical scanner described in U.S. Pat. No. 9,748,128, to Chao et al., issued Aug. 29, 2017.

As is discussed in greater detail below, the registration system 100 may utilize the optical microscope imaging or scatterometry system 102 to determine locations of registration markers (e.g., optically detectable registration markers) on a level of interest (referred to herein as an "interest level") of the semiconductor device (e.g., a top material level of the semiconductor device overlying one or more other levels). For instance, the registration system 100 may utilize the optical microscope imaging or scatterometry system 102 to determine locations of registration markers or other elements, such as conductive via ends, on an exposed surface of a wafer or through a transparent or semitransparent material via conventional optical methods. Furthermore, although a specific optical microscope imaging or scatterometry system 102 is described herein, the disclosure is not so limited, and the registration system 100 may include any convention optical scanner for locating visible registration markers and performing overlay measurements.

In the embodiment illustrated in FIG. 1, the registration system 100 may utilize the response sensor 132 to determine (e.g., read) locations of registration markers disposed within a lower level of the wafer 114 (e.g., referred to herein as a "reference level") and send captured location data to the controller 118, where it is stored in the memory 122, processed by the processor 120, and/or sent to the input/output component 124. As is discussed in greater detail below, the registration system 100 may utilize the response sensor 132 to detect one or more magnetic attributes of registration markers within the reference level of the wafer 114. In some embodiments, the registration system 100 may utilize the response sensor 132 to detect magnetic fields emitted by the registration markers disposed within the reference level of the semiconductor device, and responsive to the detected magnetic fields, the registration system 100 may determine the locations of the registration markers disposed in the reference level of the semiconductor device, as is described in greater detail below in regard to FIGS. 3-9. In additional embodiments, the registration system 100 may utilize the response sensor 132 to measure magnetizations of the registration markers disposed within the reference level of the semiconductor device, and responsive to the measured magnetizations of the registration markers, the registration system 100 may determine the locations of the registration markers disposed in the reference level of the semiconductor device 114, as is described in greater detail below in regard to FIGS. 10-12. In yet further embodiments, the registration system 100 may utilize the response sensor 132 to detect responses from registration markers (in this case, circuits) powered by the magnetic source 130, and based on the responses, the registration system 100 may determine the locations of the registration markers disposed in the reference level of the semiconductor device, as is described in greater detail below in regard to FIG. 13. Furthermore, the registration system 100 may utilize the determined locations of the registration markers within the reference level of the wafer 114 and the determined locations of the registration markers in the interest level (acquired via the optical microscope imaging or scatterometry system) to calculate a positional offset (i.e., an overlay measurement) between the interest level and the reference level.

In some embodiments, the response sensor 132 may include a magnetic sensor for detecting magnetic attributes of responses emitted by the registration markers. In one or more embodiments, the response sensor 132 may include a Hall Effect sensor. For instance, the response sensor 132 may include a transducer that varies the transducer's output voltage in response to a detected magnetic field. In additional embodiments, the response sensor 132 may include one or more of a giant magnetoresistance (GMR) sensor, a tunnel magnetoresistance (TMR) sensor, an electromagnetic radiation (EMR) sensor, or a spin hall sensor. In further embodiments, the response sensor 132 may include a magnetic force microscopy (MFM) probe (e.g., a magnetic force microscope). For instance, the response sensor 132 may include a sharp magnetized tip for scanning the registration markers, where interactions between the tip and the registration markers (e.g., deflections of the tip) are detected and utilized to reconstruct the magnetic structure of the registration markers. In some embodiments, the response sensor 132 may include one or more of a superconducting quantum interference device (SQUID) or a vibrating sample magnetometer (VSM). The operation of the response sensor 132 is described in greater detail below in regard to FIGS. 4, 5, 11, and 12.

The registration system 100 may utilize the magnetic source 130 to apply a magnetic field to the wafer 114 (e.g., emit a magnetic field through the wafer 114) and any registration markers included within the wafer 114, to magnetize the registration markers within the wafer 114, and/or to power the registration markers within the wafer 114. In some embodiments, the magnetic source 130 may include a permanent magnet. In additional embodiments, the magnetic source 130 may include an electromagnet. For instance, the magnetic source 130 may include any electromagnet known in the art. Furthermore, in some embodiments, the magnetic source 130 may be sized and shaped for applying a magnetic field to an entirety of the wafer 114 (e.g., all the registration markers within the semiconductor device 114). In other embodiments, the magnetic source 130 may be sized and shaped for applying a magnetic field to only a portion of the wafer 114 (e.g., a single registration marker, a group of registration markers, a region of the semiconductor device 114, etc.). In one or more embodiments, the magnetic source 130 may be disposed within a probe carrying the response sensor 132. For instance, the magnetic source 130 may include an inductor disposed proximate to the response sensor 132, to be used to magnetize registration markers in their respective locations without subjecting the entire wafer to magnetic fields and prior to use of sensor 102 on the probe. In other embodiments, magnetic source 130 may be omitted, and wafer 114 subjected to a magnetic source after registration markers 202 are formed and before placement of wafer 114 on substrate support 112 of registration system 100. In further embodiments, the magnetic source 130 may be carried on a probe moveable under wafer 114 in alignment with a probe carrying sensor 102 to stimulate a response from each marker aligned between the sensor 102 and the magnetic source 130.

The substrate support 112 may be configured to carry and/or move the wafer 114. The substrate support 112, which may also be characterized as a platform or a stage, may include a vacuum chuck, a mechanical chuck, and/or other suitable supporting devices. Although not shown in FIG. 1, the registration system 100 may include at least one actuator configured to move the substrate support 112 laterally (as indicated by the X-axis), transversely (as indicated by the Y-axis), and/or vertically (as indicated by the Z-axis) relative to the response sensor 132 and/or other components of the photo registration system 100. As used herein, the X-axis, Y-axis, and Z-axis as depicted in FIG. 1 define a Cartesian space. In certain embodiments, the substrate support 112 can also include position monitors (not shown) such as linear encoders, configured to monitor the position of the substrate support 112 along the X-axis, the Y-axis, and/or the Z-axis. In addition, a rotary encoder may be employed to monitor a rotational position of the wafer about the Z-axis. Even though only one substrate support 112 is shown in FIG. 1, in certain embodiments, the registration system 100 can include two, three, or any desired number of substrate supports with structures and/or functions that are generally similar to or different than the substrate support 112, so that multiple wafers may be moved into and out of alignment with the remainder of registration system 100 in an expedited fashion. In operation, the controller 118 may be used to position the substrate support 112 to properly align the wafer 114 with tools or other components associated with the registration system 100 according to aspects of the present disclosure.

Figure 2A:
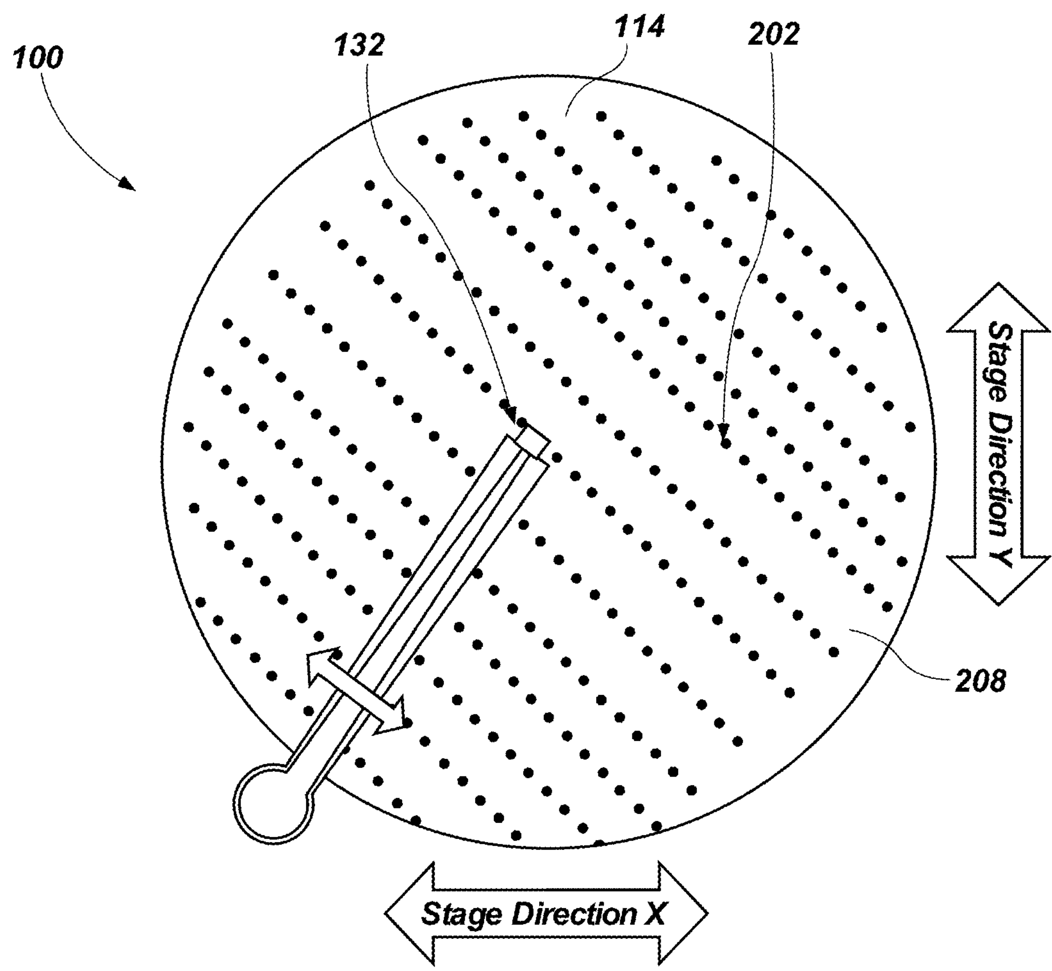
FIG. 2A is a simplified top view of a registration system and semiconductor device having registration markers formed therein according to one or more embodiments of the present disclosure.
Figure 2B:
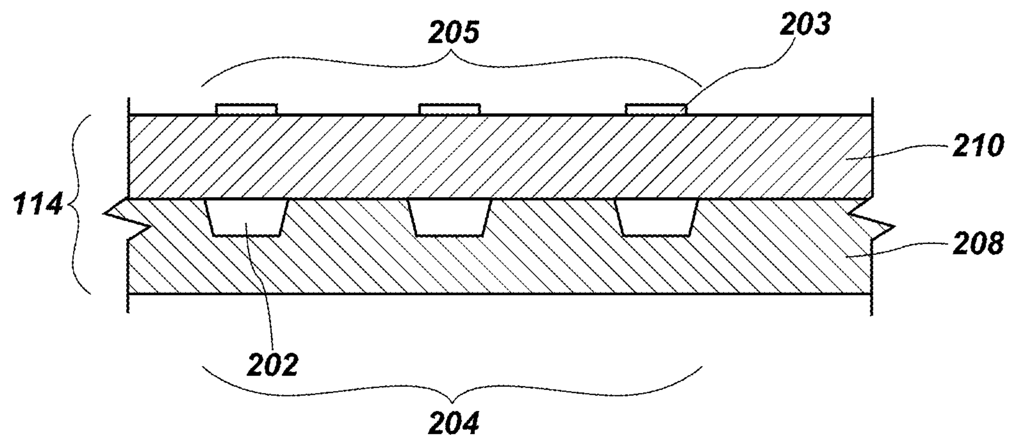
FIG. 2B is a partial side cross-sectional view of a semiconductor device having registration markers formed therein according to one or more embodiments present disclosure.

FIG. 2A is a schematic top view of a reference level 208 of a wafer 114 and response sensor 132 (e.g., probe) of a registration system (e.g., registration system 100) according to one or more embodiments of the present disclosure. FIG. 2B is a schematic partial side cross-sectional view of the wafer 114 of FIG. 2A with an interest level 210 overlying a reference level 208 (e.g., reference layer) according to one or more embodiments of the present disclosure. As will be appreciated by one of ordinary skill in the art, although the interest level 210 is depicted as being immediately adjacent to (e.g., immediately on top of) the reference level 208, the disclosure is not so limited, and one or more additional layers (e.g., levels) may be disposed between the interest level 210 and the reference level 208 of the wafer 114. Referring to FIGS. 2A and 2B together, in some embodiments, the reference level 208 of the wafer 114 may include a first set of registration markers 202 disposed within the reference level 208 of the wafer 114, and the interest level 210 may include a second set of registration markers 203 formed in or on the interest level 210 of the wafer 114. In some embodiments, one or more additional levels may be disposed between the interest level 210 and the reference level 208, and may include one or more opaque and/or relatively thick materials. For clarity, the interest level 210 has been omitted in FIG. 2A.

In some embodiments, the first set of registration markers 202 may be disposed within the reference level 208 of the wafer 114 in a first pattern 204. For instance, the first set of registration markers 202 may be oriented relative to one another in the first pattern 204 (e.g., a first registration pattern).

In one or more embodiments, each registration marker 202 of the first set of registration markers 202 may have a circular cross-section along a plane parallel to an upper surface of the reference level 208 of the wafer 114. In additional embodiments, each registration marker 202 of the first set of registration markers 202 may have any other shaped cross-section. For example, each registration marker 202 of the first set of registration markers 202 may have a general cuboid shape (e.g., flat rectangle shape). Additionally, each registration marker 202 of the first set of registration markers 202 may have any prism shape. In further embodiments, each registration marker 202 of the first set of registration markers 202 may have a frusto-conical shape as depicted in FIG. 2B.

The first set of registration markers 202 may include ferromagnetic and/or antiferromagnetic materials or any other material or structure capable of interacting with a magnetic field. As is known in the art, ferromagnetic materials contain unpaired electrons, each with a small magnetic field of its own, that align readily with each other in response to an applied external magnetic field. The alignment of the electrons tends to persist even after the external magnetic field is removed, a phenomenon called magnetic hysteresis. In some embodiments, the first set of registration markers 202 may include one or more of iron, alnico alloys (e.g., iron alloys including aluminum, nickel, and/or cobalt), bismanol (i.e., bismuth and manganese alloy), chromium (IV) oxide, cobalt, fernico alloys, ferrite, gadolinium, gallium manganese arsenide, magnadur (i.e., sintered barium ferrite), magnetite, nickel, etc. In antiferromagnetic materials, magnetic moments of atoms or molecules usually related to spins of electrons, align in a regular pattern with neighboring spins pointing in opposite directions. Antiferromagnetic materials may comprise transition metal compounds, such as oxides. Examples include hematite, chromium, iron manganese and nickel oxide.

In some embodiments, the second set of registration markers 203 may be disposed on the interest level 210 of the wafer 114 in a second pattern 205 (e.g., a second registration pattern). For instance, the second set of registration markers 203 may be oriented relative to one another in the second pattern 205. Furthermore, as is discussed in greater detail below, the second pattern 205 and the second set of registration markers 203 may be formed via conventional methods known in the art.

In one or more embodiments, the second set of registration markers 203 may correlate to the first set of registration markers 202. For example, the first pattern 204 may be at least substantially similar to the second pattern 205 such that measurements between markers included within the first pattern 204 and markers included within the second pattern 205 may be used to indicate an offset between the reference level 208 and the interest level 210 of the wafer 114. In some embodiments, each registration marker 203 of the second set of registration markers 203 may have shapes similar to the shapes of the registration markers 202 of the first set of registration markers 202 or any other conventional shapes. Furthermore, the second set of registration markers 203 may comprise conventional materials utilized for registration markers detectable and visible via conventional optical scanners and formed by conventional methods.

First Set of Embodiments

Figure 3:
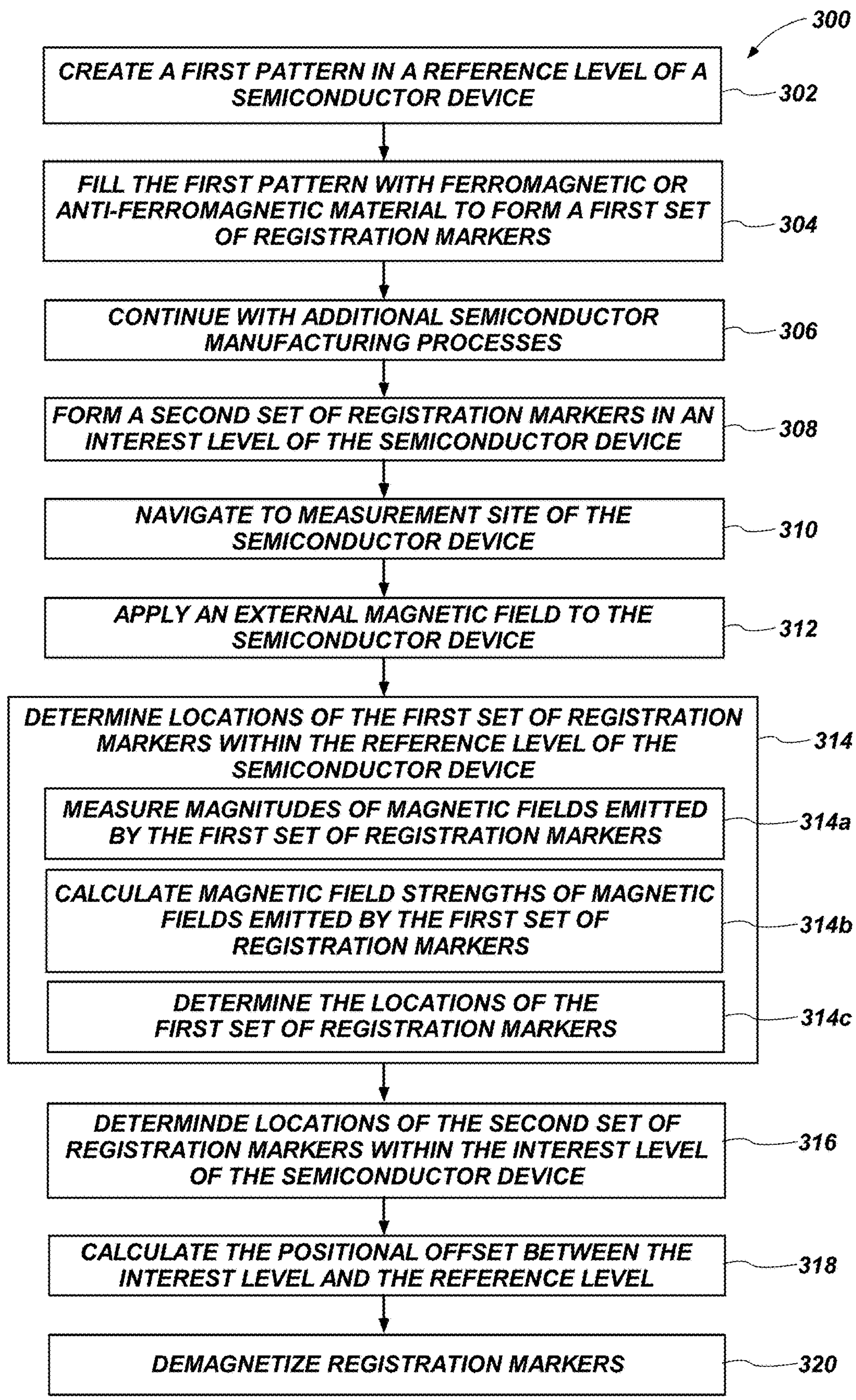
FIG. 3 is a flow diagram of a method for determining an overlay measurement between a reference level and an interest level of a semiconductor device according to one or more embodiments of the present disclosure.

FIG. 3 shows a schematic flow diagram of a method 300 for determining an overlay measurement between a reference level 208 and an interest level 210 of a wafer 114 according to a first set of embodiments of the present disclosure. As is described in greater detail below, the first set of embodiments may include procedures that involve determining locations of one or more registration markers 202 of the first set of registration markers 202 within the reference level 208 of the wafer 114 at a measurement site based on magnetic fields emitted by the first set of registration markers 202, determining locations of one or more registration markers 203 of the second set of registration markers 203 within the interest level 210 of the wafer 114 at the measurement site via optical methods, and based on the determined locations of the first and second registration markers 202, 203 at the measurement site, calculating a positional offset (e.g., an overlay measurement) between the interest level 210 and the reference level 208 of the wafer 114.

As is shown in FIG. 3, the method 300 may include creating a first pattern 204 (i.e., a reference level pattern) of recesses in a surface (e.g., an upper surface) of the reference level 208 of the wafer 114 by removing material from the reference level 208 of the wafer 114, as shown in act 302. In some embodiments, the reference level 208 may be semiconductor material of wafer 114 prior to any processing thereof to form integrated circuitry. In some embodiments, a photolithography system may be used to create the first pattern 204 in a surface (i.e., an active surface) of wafer 114 via conventional lithographic processes and methods. For instance, a photolithography system may utilize photoresist application, patterning, and development over active surface, after which semiconductor material may be removed, as by wet or dry etching (e.g., chemical or reactive ion etching) in areas unmasked by the photoresist. As another approach, focused ion beam processes (e.g., ion milling), etc. may be used to create the first pattern 204. The recesses are then filled with a magnetic or anti magnetic material as described below.

In some embodiments, a conventional photolithography system may be used to form the first pattern 204 such that resulting first set of registration markers 202 (described below in regard to acts 304 and 312) formed within the first pattern 204 have a particular orientation and/or geometry. For instance, the photolithography system may be used to form the first pattern 204 such that the registration markers 202 of the first set of registration markers 202 have poles (e.g., magnetic poles) disposed along a particular axis (e.g., X-axis, Y-axis, or Z-axis) of the Cartesian space defined above in regard to FIG. 1. Additionally, the photolithography system may be used to form the first pattern 204 such that the registration markers 202 of the first set of registration markers 202 have particular geometries. Furthermore, because the original orientations and geometries of the first set of registration markers 202 are known, the registration system may be used to determine selected orientations, geometries, and locations of the first set of registration markers 202. In other words, the photolithography system may implement known orientations, geometries, and locations of the first set of registration markers 202.

In some embodiments, the photolithography system may form the first pattern 204 such that longitudinal lengths of the resulting registration markers 202 are at least substantially parallel to one of the X-axis, Y-axis, or Z-axis of the Cartesian space. Furthermore, the photolithography system may form the first pattern 204 such that each registration marker 202 of the first set of registration markers 202 has a common orientation.

The method 300 may also include filling recesses of the first pattern 204 with ferromagnetic and/or antiferromagnetic materials or any other material or structure capable of interacting with a magnetic field to form the first set of registration markers 202, as shown in act 304 of FIG. 3. For instance, act 304 may include filling recesses of the first pattern 204 with any of the materials described above in regard to FIGS. 2A and 2B. Furthermore, recesses of the first pattern 204 may be filled via conventional methods. For example, be blanket deposited to fill recesses of the first pattern 204 via electroplating, electroless plating, physical vapor deposition, chemical vapor deposition, ion beam deposition, thin film deposition, etc. The active surface of wafer 114 may then be planarized by, for example, chemical mechanical planarization to remove deposited material other than in the recesses. In alternative embodiments, the method 300 may not include forming one or more recesses in the wafer 114 and then filling the one or more recesses with magnetic material. Rather, the method 300 may include depositing magnetic material on the wafer and patterning the magnetic material directly. In some embodiments, the recesses of the pattern 204 may be filled to enable for greater dry etches and critical path method of critical dimension uniformity while not effecting the registration markers' 202 performance.

In some embodiments, the first set of registration markers 202 formed via filling recesses of the first pattern 204 may include nanostructures. For example, each registration marker 202 of the first set of registration markers 202 may have at least one dimension on the nanoscale. In additional embodiments, the first set of registration markers 202 formed via filling the pattern 204 may include microstructures. For instance, each registration marker 202 of the first set of registration markers 202 may have at least one dimension on the microscale. As a non-limiting example, in one or more embodiments, a registration marker 202 of the first set of registration markers 202 may include a 500 nm×100 μm×20 μm rectangular prism registration marker. In additional embodiments, a registration marker 202 of the first set of registration markers 202 may include a 4 μm×100 μm×20 μm rectangular prism registration marker. In further embodiments, a registration marker 202 of the first set of registration markers 202 may include a 500 nm×50 μm×5 μm rectangular prism registration marker. In yet further embodiments, a registration marker 202 of the first set of registration markers 202 may include a 1.5 μm×1.5 μm×250 μm pillar registration marker. Although specific dimensions are described herein, the first set of registration markers 202 may additionally include registration markers having any conventional dimension of registration markers.

After filling recesses of the first pattern 204 with ferromagnetic and/or antiferromagnetic materials or any other material or structure capable of interacting with a magnetic field, processing of wafer 114 may continue with additional semiconductor fabrication processes (e.g., depositing overlying layers, etching processes, etc.) until an interest level 210 of the wafer 114 is reached, as shown in act 306 of FIG. 3. For example, one or more substrates (e.g., the interest level 210 and/or additional overlying layers) may be formed (e.g., deposited) over the reference level 208 and the first set of registration markers 202 of the wafer 114.

Upon arriving at the interest level 210 of the wafer 114, the method 300 may include forming a second set of registration markers 203 on the interest level 210 of the wafer 114, as shown in act 308 of FIG. 3. For example, the registration system 100 may be used to form the second set of registration markers 203 on the interest level 210 of the wafer 114. In some embodiments, forming the second set of registration markers 203 may include forming a second pattern 205 of registration markers 203 on the interest level 210 of the wafer 114. Furthermore, the second pattern 205 may correlate to (e.g., may be at least substantially the same shape and size as) the first pattern 204 of the first set of registration markers 202. For instance, every registration marker 203 of the second pattern 205 may have a correlating registration marker 202 of the first pattern 204. Additionally, in one or more embodiments, forming the second set of registration markers 203 on the interest level 210 of the wafer 114 may include forming conventional markers that can be detected and utilized by conventional optical scanning systems of photolithography systems (e.g., the optical microscope imaging or scatterometry system of FIG. 1). For example, forming the second set of registration markers 203 on the interest level 210 of the wafer 114 may include forming markers via any of the methods described in U.S. Pat. No. 7,463,367, to Bowes, issued Dec. 9, 2008, U.S. Pat. No. 8,313,877, to Chung, issued Nov. 20, 2012, and/or U.S. Pat. No. 6,822,342, to Baluswamy et al., issued Nov. 23, 2004.

As will be appreciated by one of ordinary skill in the art, in one or more embodiments, a given registration marker 202 of the first set of registration markers 202 and a correlating registration marker 203 of the second set of registration markers 203 may not have a same shape. However, in such embodiments, at least a portion of the given registration marker 202 of the first set of registration markers 202 correlates to at least a portion of the correlating registration marker 203 of the second set of registration markers 203 within the first and second patterns 204, 205. For example, in some embodiments, a center point (e.g., a centroid) of the given registration marker 202 of the first set of registration markers 202 may correlate to a center point (e.g., a centroid) of the correlating registration marker 203 of the second set of registration markers 203. In other words, the center point of the of the given registration marker 202 of the first set of registration markers 202 may be at a same point within the first pattern 204 as the center point (e.g., centroid) of the correlating registration marker 203 of the second set of registration markers 203 is within the second pattern 205. In additional embodiments, a side, edge, point, or any other feature of the given registration marker 202 of the first set of registration markers 202 may correlate to a portion of the correlating registration marker 203 of the second set of registration markers 203 within the first and second patterns 204, 205 such that a positional offset between the given registration marker 202 of the first set of registration markers 202 correlating registration marker 203 of the second set of registration markers 203 may be calculated.

Referring still to FIG. 3, when initiating an overlay measurement between the reference level 208 and the interest level 210 of the wafer 114, the method 300 may include navigating to a measurement site, as shown in act 310 of FIG. 3. For instance, the registration system 100 may navigate the response sensor 132 over the wafer 114 to a location of a registration marker 203 of the second set of registration markers 203 at a desired measurement site. For instance, the registration system 100 may manipulate one or more of the response sensor 132 and the substrate support 112 via the controller 118 via any of the manners described above in regard to FIG. 1 to navigate the response sensor 132 to the measurement site of the wafer 114.

Upon navigating the response sensor 132 to the measurement site of the interest level 210 of the wafer 114, the method 300 may include applying an external magnetic field to the wafer 114, as shown in act 312 of FIG. 3, if the first set of registration markers has not already been magnetized, for example after registration markers 202 have been formed and before wafer 114 is placed on substrate support of registration system 100. In particular, the registration system 100 may apply an external magnetic field to at least one registration marker 202 of the first set of registration markers 202 within the reference level 208 at the measurement site of the wafer 114. In some embodiments, the registration system 100 may apply an external magnetic field to the wafer 114 (e.g., subject the wafer 114 to a magnetic field) via the magnetic source 130 described above in regard to FIG. 1. For example, the registration system 100 may supply a current through a coil of wire wrapped around an iron core to create an external magnetic field. In some embodiments, the registration system 100 may supply a sufficient amount of current to create an external magnetic field having a strength greater than 25 Oersteds (Oe). In some embodiments, applying the external magnetic field to the wafer 114 is optional. For instance, the registration markers 202 may already be magnetized or may be interacting within magnetic fields.

In some embodiments, the registration system 100 may apply an initial external magnetic field ($H_{ex}$) to the wafer 114 to orient vectors of a resulting magnetic field of the at least one registration marker 202 of the first set of registration markers 202. For instance, the registration system 100 may apply an initial external magnetic field ($H_{ex}$) to the wafer 114 to rotate all domains within the at least one registration marker 202 of the first set of registration markers 202 to be in known directions. As a result, and as is discussed in further detail below, orienting all the domains of the at least one registration marker of the first set of registration markers 202 enables the registration system 100 to determine (e.g., know, set, etc.) an expected magnetic field for the at least one registration marker of the first set of registration markers 202 (e.g., a magnetic field that is expected to be emitted by the at least one registration marker 202 of the first set of registration markers 202 in response to being magnetized). Furthermore, applying the initial external magnetic field ($H_{ex}$) to the wafer 114 forces the resulting magnetic field of the at least one registration marker 202 of the first set of registration markers 202 to be oriented in a particular (e.g., expected) orientation and direction.

After applying the initial external magnetic field to the wafer 114, the registration system 100 may apply an additional external magnetic field to the wafer 114 to at least partially magnetize the at least one registration marker 202 of the first set of registration markers 202 within the measurement site of the wafer 114. In some embodiments, the registration system 100 may apply the additional external magnetic field to the wafer 114 in a particular direction. For example, the registration system 100 may apply the additional external magnetic field to the wafer 114 in plane with the wafer 114. In other words, the registration system 100 may apply the additional external magnetic field to the wafer 114 along a plane that is parallel to an upper surface of the reference level 208 of the wafer 114. In additional embodiments, the registration system 100 may apply the additional external magnetic field to the wafer 114 out of plane with the wafer 114. Put another way, the registration system 100 may apply the additional external magnetic field to the wafer 114 along a plane that is perpendicular to or forming an acute angle with the upper surface of the reference level 208 of the wafer 114.

In some embodiments, a direction in which the external magnetic field is emitted through the wafer 114 may be dependent on orientation of the first set of registration markers 202 within the wafer 114. For example, in one or more embodiments, the registration system 100 may emit the external magnetic field in a direction that is parallel to or perpendicular to a direction extending from a first pole (e.g., north-seeking pole) of a given registration marker 202 to a second pole (e.g., south-seeking pole) of the given registration marker 202 of the first set of registration markers 202. As mentioned briefly above, the direction in which the external magnetic field is applied to the first set of registration markers 202 may determine expected responses of the first set of registration markers 202 (e.g., expected resulting magnetic fields of the first set of registration markers 202).

In one or more embodiments, the registration system 100 may only apply a single external magnetic field to the wafer 114 to both orient the domains of the at least one registration marker 202 of the first set of registration markers 202 and to magnetize the at least one registration marker 202 of the first set of registration markers 202. In other words, the registration system 100 may not apply a second subsequent external magnetic field to the wafer 114 in every embodiment.

As will be appreciated by one of ordinary skill in the art, applying an external magnetic field to a ferromagnetic and/or antiferromagnetic materials may cause residual (e.g., remanent) magnetic fields to be emitted by the first set of registration markers 202 even after removing the applied external magnetic field. For instance, the first set of registration markers 202 may maintain a remanence (e.g., remanent magnetization or residual magnetism). Furthermore, because the first pattern 204 in which the first set of registration markers 202 was formed is known, and because the original orientation of the first set of registration markers 202 is known, the first set of registration markers 202 has expected pole locations, sizes, geometries, and orientations relative to one another and within the reference level 208 of the wafer 114. Referring to acts 302, 304, and 312 together, in some embodiments, the registration system 100 may create the first pattern 204 and first set of registration markers 202 and may apply the external magnetic field to result in the poles of the first set of registration markers 202 being aligned along one of the axes of the Cartesian space defined above (e.g., the X-axis, Y-axis, or Z-axis). As a result, the first set of registration markers 202 may have expected resulting magnetic fields along the axes of the Cartesian space.

Upon applying an external magnetic field, the method 300 may include determining (e.g., reading) a location of at least one registration marker of 202 the first set of registration markers 202 within the reference level 208 of the wafer 114 at the measurement site, as shown in act 314 of FIG. 3. In some embodiments, a location of at least one registration marker of 202 of the first set of registration markers 202 within the reference level 208 of the wafer 114 at the measurement site may include one or more of 1) measuring a magnitude of the magnetic field (i.e., residual magnetic field) emitted by the at least one registration marker 202 of the first set of registration markers 202 in a scalar form along one or more axes, as shown in act 314*a,* 2) calculating a magnetic field strength of the magnetic field emitted by the at least one registration marker 202 of the first set of registration markers 202 in a vector form along one or more axes, as shown in act 314*b*, and ultimately, 3) determining the location of the at least one registration marker 202 of the first set of registration markers 202 based on data determined in acts 314*a* and/or 314*b*, as shown in act 314*c*. Furthermore, in some embodiments, act 312 of FIG. 3 (i.e., the act of applying a magnetic field) may be repeated during and/or between any of the actions taken in act 314 to maintain and/or recreate magnetic fields within the at least one registration marker 202 of the first set of registration markers 202.

Figure 4:
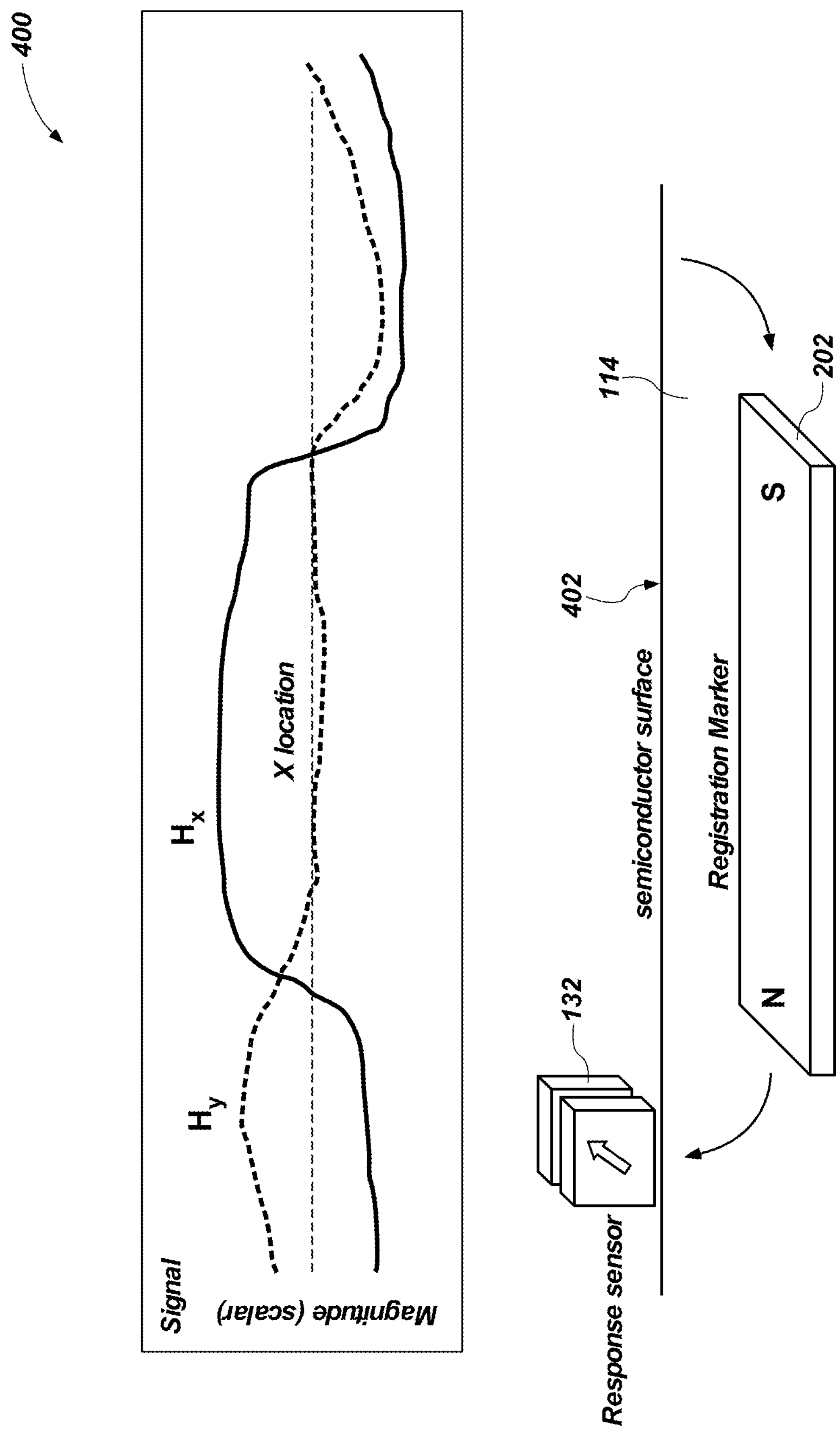
FIG. 4 is a schematic representation of a sensor oriented over an registration marker within a semiconductor device and a scalar magnitude of a measured magnetic field emitted by the registration marker according to one or more embodiments of the present disclosure.

FIG. 4 is a schematic representation 400 of at least one registration marker 202 of the first set of registration markers 202 within a reference level 208 of a wafer 114 and a response sensor 132 of a registration system (e.g., registration system 100) disposed over the wafer 114. Additionally, FIG. 4 shows example scalar magnitudes of magnetic fields detected via the response sensor 132 when passing the response sensor 132 over an upper surface 402 of the wafer 114 and above the at least one registration marker 202 of the first set of registration markers 202 within the wafer 114. Referring to act 314*a* of FIG. 3 and FIG. 4 together, the registration system 100 may pass the response sensor 132 over the upper surface 402 of the wafer 114 to detect the magnetic field emitted by the at least one registration marker 202 of the first set of registration markers 202 within the wafer 114. In some embodiments, the registration system 100 may pass the response sensor 132 over the wafer 114 along one or more of the X-axis, Y-axis, and/or Z-axis of the Cartesian space defined above in regard to FIG. 1. For instance, the registration system 100 may pass the response sensor 132 along the X-axis to detect magnitudes of the magnetic field emitted by the at least one registration marker 202 of the first set of registration markers 202 along the X-axis of the Cartesian space. As noted above, within the first set of embodiments, the response sensor 132 may include one or more of a Hall Effect sensor, a GMR sensor, a TMR sensor, an EMR sensor, or a spin hall sensor.

In some embodiments, the registration system 100 may pass the response sensor 132 over the upper surface 402 of the wafer 114 along multiple axes (e.g., both the X-axis and the Y-axis) of the Cartesian space to detect magnitudes of a magnetic field emitted by the at least one registration marker 202 of the first set of registration markers 202 at the measurement site of the wafer 114 along the multiple axes. In one or more embodiments, a selected location and orientation of the at least one registration marker 202 of the first set of registration markers 202 may determine along which axes the registration system 100 passes the response sensor 132 to detect (e.g., search for) the magnetic field emitted by the at least one registration marker 202 of the first set of registration markers 202.

Additionally, referring to act 314*b* of FIG. 3, as noted above, in some embodiments, determining a location of the at least one registration marker 202 of the first set of registration markers 202 within the reference level 208 of the wafer 114 at the measurement site may include calculating the magnetic field strength of the magnetic field emitted by the at least one registration marker 202 of the first set of registration markers 202 in vector form. In some embodiments, the registration system 100 may calculate the magnetic field strength of the magnetic field emitted by the at least one registration marker 202 of the first set of registration markers 202 in vector form by approximating the magnetic field as a dipole and/or surface magnetic moment. For example, FIG. 5 is a schematic representation 500 of at least one registration marker 202 of the first set of registration markers 202 disposed within a reference level 208 of the wafer 114 and a response sensor 132 of a registration system (e.g., registration system 100) disposed over the wafer 114.

Figure 5:
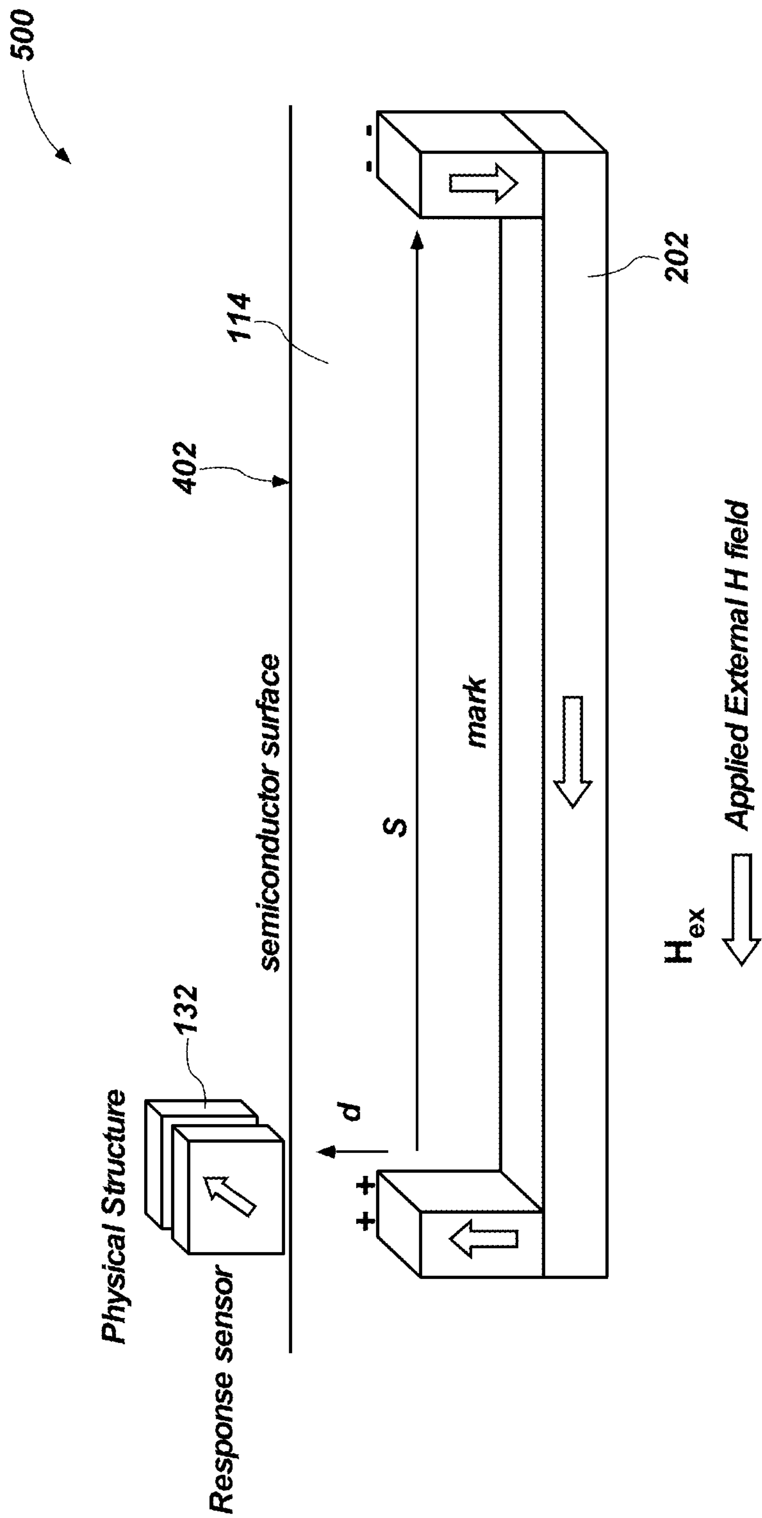
FIG. 5 is a schematic representation of a sensor oriented over a registration marker within a semiconductor device according to one or more embodiments of the present disclosure.

Referring to FIGS. 3 and 5 together, the registration system 100 may pass the response sensor 132 over the upper surface 402 of the wafer 114 to detect the magnetic field emitted by the at least one registration marker 202 of the first set of registration markers 202 of the wafer 114 via any of the manners described above in regard to FIG. 4. Furthermore, as will be understood by one of ordinary skill in the art, when the poles of a registration marker 202 are closely spaced relative to an observation distance (d), the magnetic field strength of the magnetic field emitted by the registration markers can be approximated as a dipole $$\left(\frac{1}{r^3}\text{dependence}\right).$$

Additionally, when the poles of a registration marker are widely spaced relative to the observation distance (d), the magnetic field strength of the magnetic field emitted by the registration markers can be approximated by the surface magnetic moment $$\left(\frac{1}{r^2}\text{dependence}\right).$$

For instance, the magnetic field strength may be calculated via the following equation:

$$H_{dip} = \frac{1}{\mu_0}\frac{3(m * r)r - mr^2}{r^5}$$

where $H_{dip}$ is the magnetic field strength in vector form, r is the vector from the position of the dipole to the position where the magnetic field is being measured, r is the absolute value of r: the distance from the dipole, m is the vector dipole moment, and $\mu_0$ is the permeability of free space.

By utilizing the response sensor 132 and responsive to passing the response sensor 132 over the wafer 114 along multiple axes, the processor 120 of registration system 100 may calculate the magnetic field strength of the magnetic field emitted by the at least one registration marker 202 of the first set of registration markers 202 in vector form (e.g., $H_x$, $H_y$, and $H_z$) along one or more of the X-axis, the Y-axis, and the Z-axis of the Cartesian space. As a result, the registration system 100 may calculate a representation of the magnetic field in vectors. In some embodiments, the foregoing equation and approximations may drive the size and shape of the registration markers 202 of the first set of registration markers 202 created via acts 302, 304, and 312 of FIG. 3, and as a result, the first pattern 204 formed in act 302 of FIG. 3. For instance, the size and shape of each registration marker 202 of the first set of registration markers 202 (e.g., the pattern 204 for forming the registration markers 202) may be designed to have resulting magnetic poles of each registration marker 202 of the first set of registration markers 202 be widely or closely spaced such that the resulting magnetic fields can be approximated according to one of the above mentioned methods.

In some embodiments, the registration system 100 may perform both acts 314*a* and 314*b* when determining a location of a registration marker 202 of the first set of registration markers 202 within the reference level 208 of the wafer 114. In other embodiments, the registration system

100 may perform only one of acts 314*a* and 314*b* when determining a location of a registration marker 202 of the first set of registration markers 202 within the reference level 208 of the wafer 114. In other words, both of acts 314*a* and 314*b* are not required in every embodiment of the present disclosure.

The following are examples of simulations performed by the inventors within the scope of the first set of embodiments where the magnetic field strengths of magnetic fields emitted by registration markers are calculated.

Example 1

Figure 6:
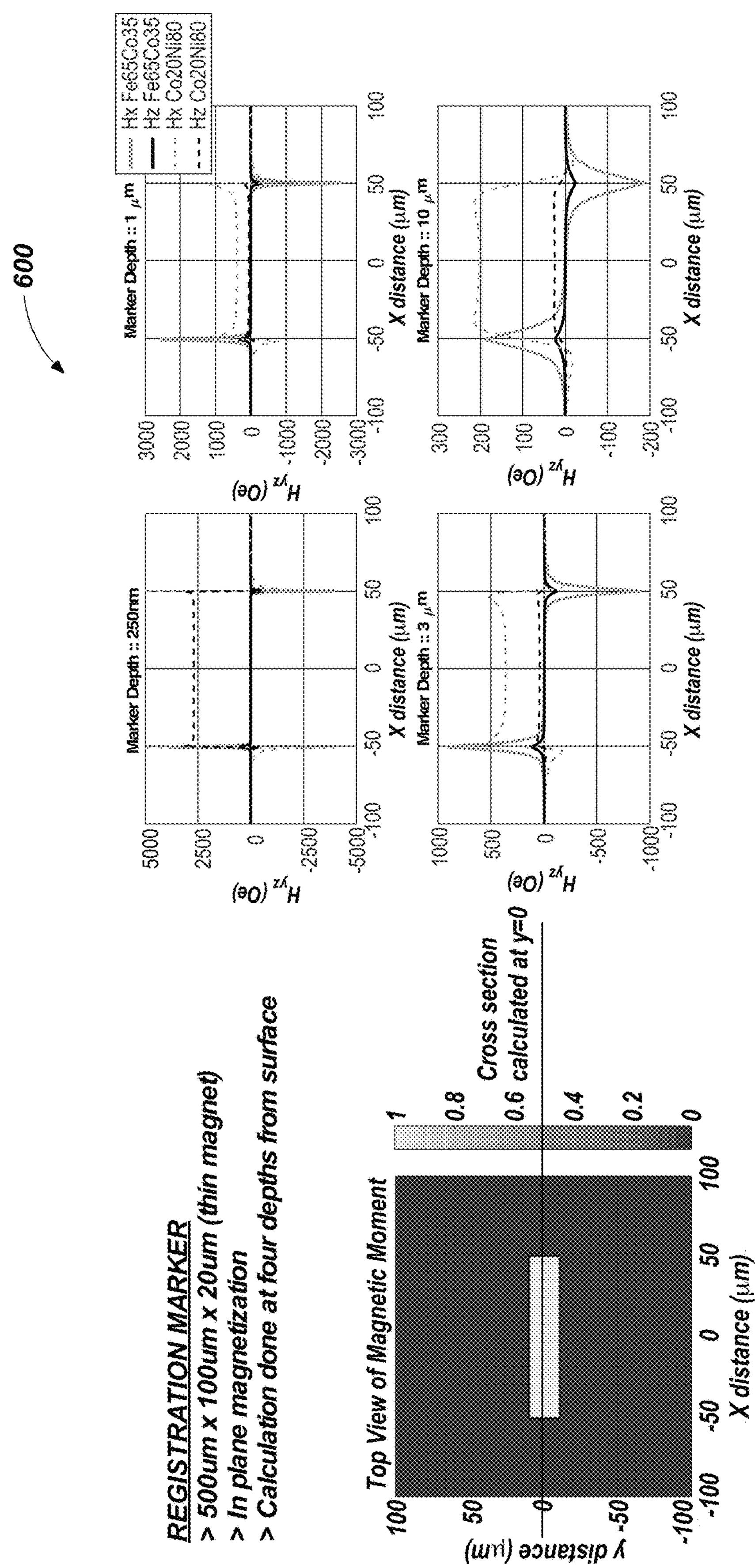
FIG. 6 shows example measurements acquired via testing performed by the inventors.

FIG. 6 shows testing results 600 from laboratory testing from a first example. Referring to FIGS. 3-6 together, in the laboratory tests, two types of 500 nm×100 μm×20 μm registration markers (relatively thin specimen) were disposed within respective wafers. The first type of registration marker included Fe65Co35, and the second type of registration marker included Co20Ni80. Four registration markers of the first type of registration markers were disposed at varying depths (250 nm, 1 μm, 3 μm, and 10 μm) within four respective wafers. Additionally, four registration markers of the second type of registration markers were disposed at varying depths (250 nm, 1 μm, 3 μm, and 10 μm) within four respective wafers. All of the wafers were subjected to a magnetic field greater than 25 Oe. Furthermore, the wafers were subjected to an in plane magnetic field (e.g., magnetic field emitted in a direction parallel to a plane defined by an upper surface of a respective wafer). After subjecting the wafers to the magnetic field, the residual magnetic fields of the registration markers were detected at the four correlating depths of the registration markers (250 nm, 1 μm, 3 μm, and 10 μm) and along both the X-axis and the Z-axis utilizing one or more of the sensors described above. Furthermore, based on the detected magnetic fields, the correlating magnetic field strengths were calculated along both the X-axis and the Z-axis (shown in the associated graphs of FIG. 6) via one or more of the approximation methods described above.

Example 2

Figure 7:
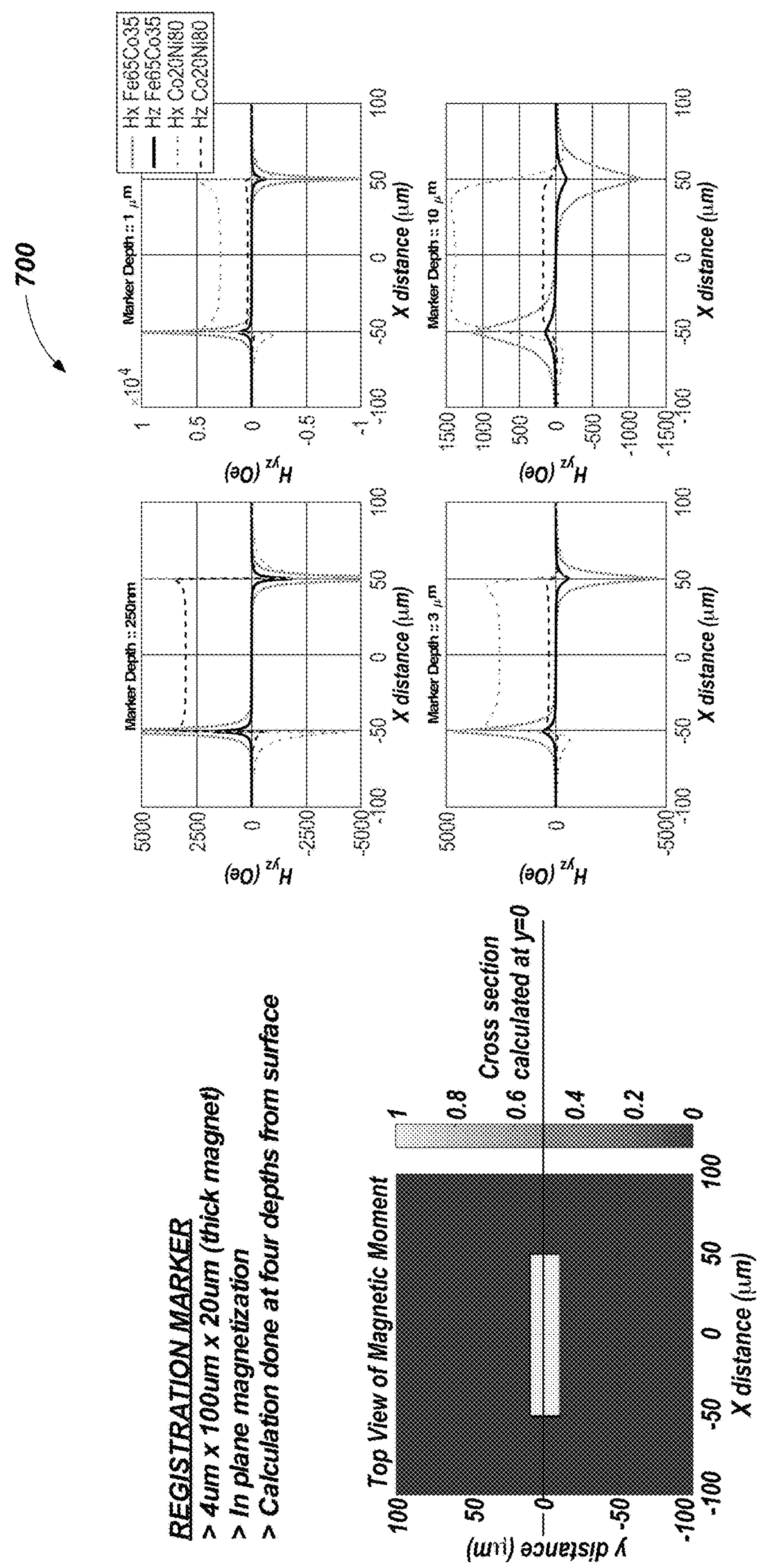
FIG. 7 shows example measurements acquired via testing performed by the inventors.

FIG. 7 shows testing results 700 from laboratory testing from a second example. Referring to FIGS. 3-5 and 7 together, in the laboratory tests, two types of 4.0 μm×100 μm×20 μm registration markers (relatively thick specimen) were disposed within respective wafers. The first type of registration marker included Fe65Co35, and the second type of registration marker included Co20Ni80. Four registration markers of the first type of registration markers were disposed at varying depths (250 nm, 1 μm, 3 μm, and 10 μm) within four respective wafers. Additionally, four registration markers of the second type of registration markers were disposed at varying depths (250 nm, 1 μm, 3 μm, and 10 μm) within four respective wafers. All of the wafers were subjected to a magnetic field greater than 25 Oe. Furthermore, the wafers were subjected to an in plane magnetic field (e.g., magnetic field emitted in a direction parallel to a plane defined by an upper surface of a respective wafers). After subjecting the wafers to the magnetic field, the residual magnetic fields of the registration markers were detected at the four correlating depths of the registration markers (250 nm, 1 μm, 3 μm, and 10 μm) and along both the X-axis and the Z-axis utilizing one or more of the sensors described above. Furthermore, based on the detected magnetic fields, the correlating magnetic field strengths were calculated along both the X-axis and the Z-axis (shown in the associated graphs of FIG. 7) via one or more of the approximation methods described above.

Example 3

Figure 8:
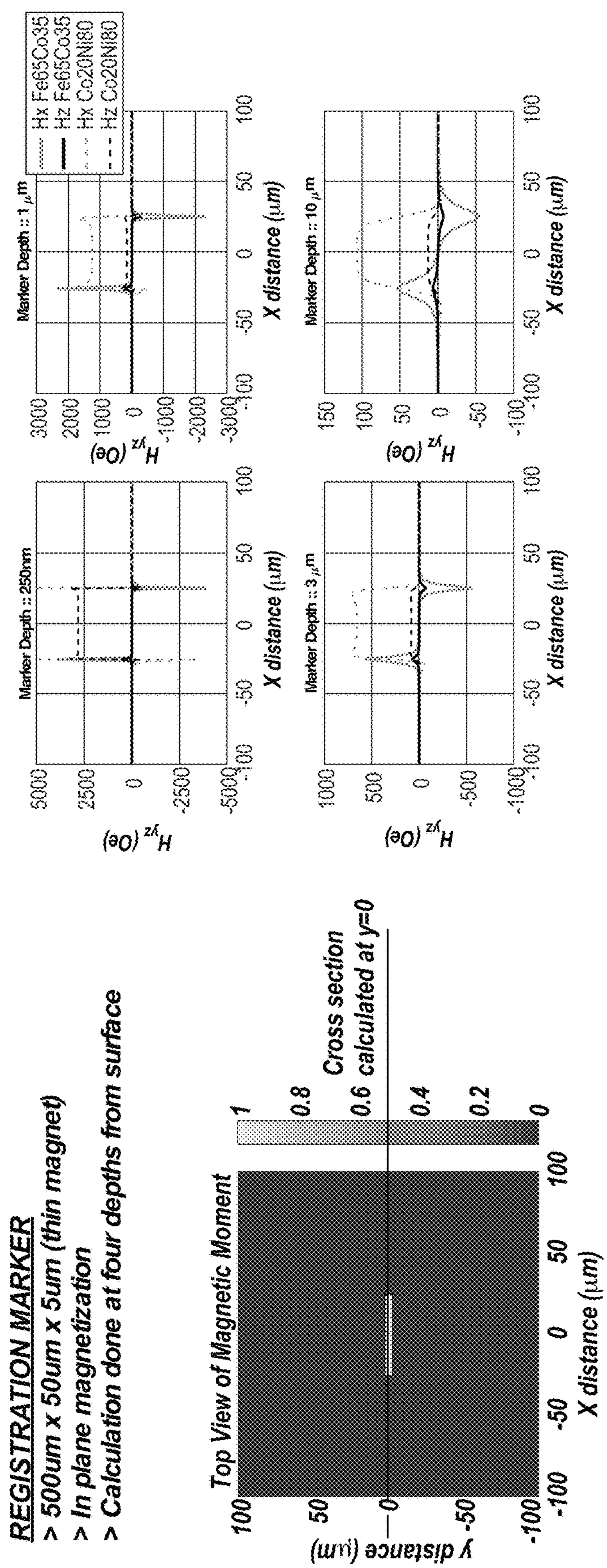
FIG. 8 shows example measurements acquired via testing performed by the inventors.

FIG. 8 shows testing results 800 from laboratory testing from a third example. Referring to FIGS. 3-5 and 8 together, in the laboratory tests, two types of 500 nm×50 μm×5 μm registration markers (relatively thin specimen) were disposed within respective wafers. The first type of registration marker included Fe65Co35, and the second type of registration marker included Co20Ni80. Four registration markers of the first type of registration markers were disposed at varying depths (250 nm, 1 μm, 3 μm, and 10 μm) within four respective wafers. Additionally, four registration markers of the second type of registration markers were disposed at varying depths (250 nm, 1 μm, 3 μm, and 10 μm) within four respective wafers. All of the wafers were subjected to a magnetic field greater than 25 Oe. Furthermore, the wafers were subjected to an in plane magnetic field (e.g., magnetic field emitted in a direction parallel to a plane defined by an upper surface of a respective wafers). After subjecting the wafers to the magnetic field, the residual magnetic fields of the registration markers were detected at the four correlating depths of the registration markers (250 nm, 1 μm, 3 μm, and 10 μm) and along both the X-axis and the Z-axis utilizing one or more of the sensors described above. Furthermore, based on the detected magnetic fields, the correlating magnetic field strengths were calculated along both the X-axis and the Z-axis (shown in the associated graphs of FIG. 8) via one or more of the approximation methods described above.

Example 4

Figure 9:
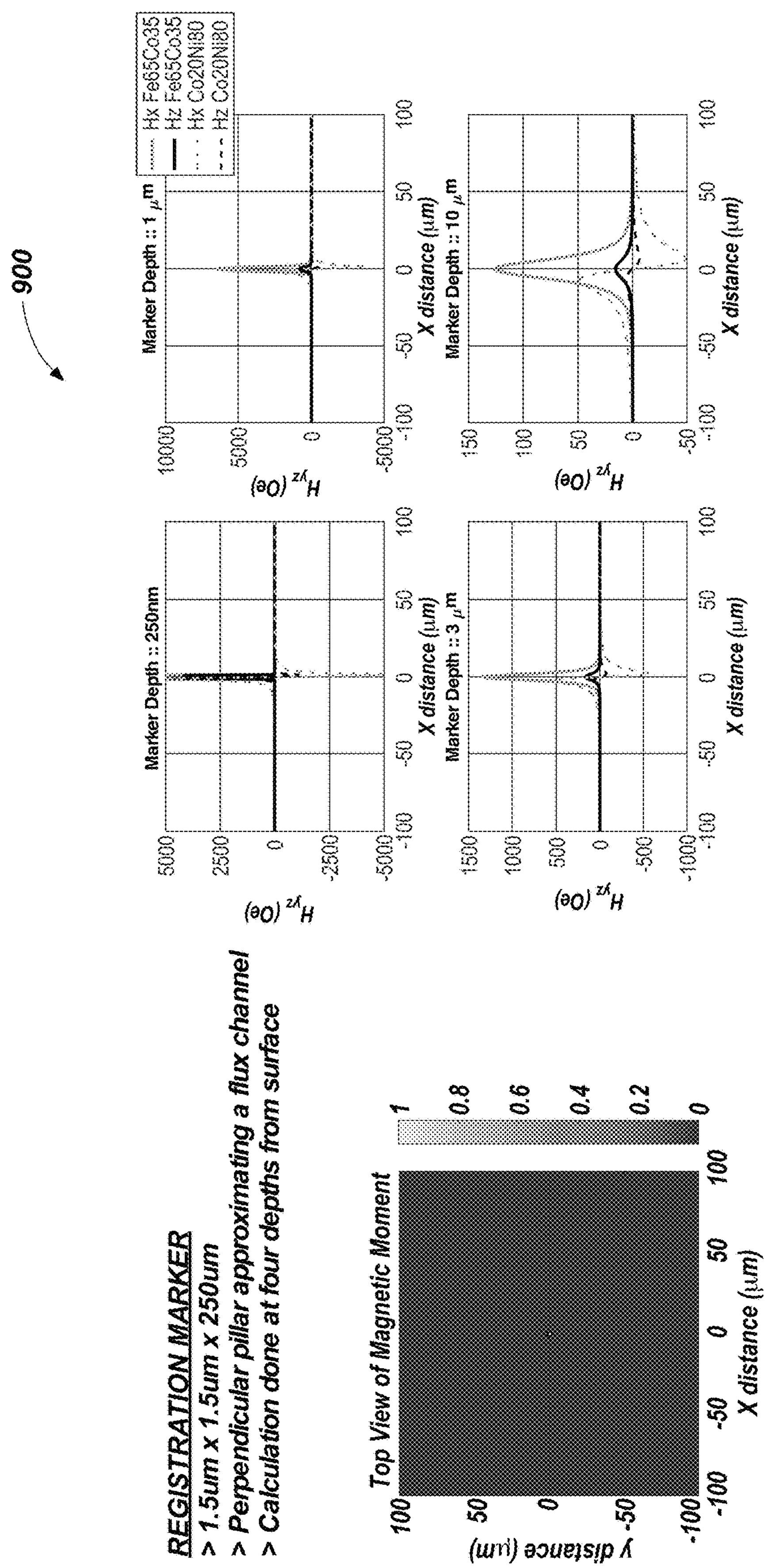
FIG. 9 shows example measurements acquired via testing performed by the inventors.

FIG. 9 shows testing results 900 from laboratory testing from a fourth example. Referring to FIGS. 3-5 and 9 together, in the laboratory tests, two types of 1.5 μm×1.5 μm×250 μm registration markers (specimen shaped like a rod) were disposed within respective wafers in a direction perpendicular to EXAMPLES 1-3. The first type of registration marker included Fe65Co35, and the second type of registration marker included Co20Ni80. Four registration markers of the first type of registration markers were disposed at varying depths (250 nm, 1 μm, 3 μm, and 10 μm) within four respective wafers. Additionally, four registration markers of the second type of registration markers were disposed at varying depths (250 nm, 1 μm, 3 μm, and 10 μm) within four respective wafers. All of the wafers were subjected to a magnetic field greater than 25 Oe. Furthermore, the wafers were subjected to an out of plane magnetic field (e.g., magnetic field emitted in a direction perpendicular to a plane defined by an upper surface of a respective wafers). After subjecting the wafers to the magnetic field, the residual magnetic fields of the registration markers were detected at the four correlating depths of the registration markers (250 nm, 1 μm, 3 μm, and 10 μm) and along both the X-axis and the Z-axis utilizing one or more of the sensors described above. Furthermore, based on the detected magnetic fields, the correlating magnetic field strengths were calculated along both the X-axis and the Z-axis (shown in the associated graphs of FIG. 9) via one or more of the approximation methods described above.

Referring again to FIG. 3, based on the data acquired and/or calculated via one or more of acts 314*a* and 314*b* (e.g., scalar and/or vector representations of the magnetic field of the at least one registration marker 202 of the first set of registration markers 202 along axes of the Cartesian space), the registration system 100 may determine the location of the at least one registration marker 202 of the first set of registration markers 202 in three dimensions (e.g., in the X-axis, Y-axis, and Z-axis) within the wafer 114 at the measurement site, as shown in act 314*c* of FIG. 3. In other words, in some embodiments, the registration system 100 may determine the location of at least one registration marker 202 of the first set of registration markers 202 as a vector plot.

In the first set of embodiments, as is mentioned briefly above, the geometries and original orientations and locations of the first set of registration markers 202 (and the at least one registration marker 202) are known, and as a result, the first set of registration markers 202 have expected magnetic field profiles (e.g., three expected vector components of the magnetic field profiles). Furthermore, based on the expected magnetic field of the at least one registration marker 202 of the first set of registration markers 202 and the actual measured/calculated magnetic fields of the at least one registration marker 202 of the first set of registration markers 202, the registration system 100 may determine the actual location of the at least one registration marker 202 of the first set of registration markers 202. For instance, as will be understood by one of ordinary skill in the art, the registration system 100 may utilize significant features of known data such as, for example, known locations of minimums, maximum, zero crossing values, and maximum derivatives of the expected magnetic field and original orientation of the at least one registration marker 202 of the first set of registration markers 202 within an ideal grid relative to significant features of measured and/or calculated data such as, for example, the actual calculated and/or measured minimums, maximums, zero crossing values, and maximum derivatives of the detected magnetic field to determine a location (e.g., a precise location) of the at least one registration marker 202 of the first set of registration markers 202 within the reference level 208 of the wafer 114. As a non-limiting example, if an expected response signal is a sinusoidal or other periodic response (e.g., FIG. 4), the registration system 100 may utilize the significant features of the expected response signal and significant features of the measured/calculated response signal to determine the actual location of the at least one registration marker 202 of the first set of registration markers 202.

In addition to determining a location of the at least one registration marker 202 of the first set of registration markers 202 within the reference level 208 of the wafer 114 at the measurement site, the method 300 may include determining a location of at least one registration marker 203 of the second set of registration markers 203 on the interest level 210 of the wafer 114 at the measurement site, as shown in act 316 of FIG. 3. For instance, the registration system 100 may utilize the optical microscope imaging or scatterometry system described above in regard to FIG. 1 to detect the at least one registration marker 203 of the second set of registration markers 203 on the interest level 210 of the wafer 114 at the measurement site. For example, the registration system 100 may detect the at least one registration marker 203 of the second set of registration markers 203 via any conventional optical methods. For example, the registration system 100 may detect the at least one registration marker 203 of the second set of registration markers 203 via any of the methods described in U.S. Pat. No. 7,463,367, to Bowes, issued Dec. 9, 2008, U.S. Pat. No. 8,313,877, to Chung, issued Nov. 20, 2012, and/or U.S. Pat. No. 6,822,342, to Baluswamy et al., issued Nov. 23, 2004.

Upon determining the locations of the at least one registration marker 202 of the first set of registration markers 202 and the at least one registration marker 203 of the second set of registration markers 203 at the measurement site, the method 300 may include calculating a positional offset (e.g., an overlay measurement) between the interest level 210 and the reference level 208 of the wafer 114, as shown in act 318 of FIG. 3. For instance, based on the locations of the at least one registration marker 202 of the first set of registration markers 202 within the reference level 208 and the at least one registration marker 203 of the second set of registration markers 203 within the interest level 210, the registration system 100 may be used to calculate the positional offset via conventional methods. As a non-limiting example, the method 300 may include calculating the positional offset based on two registration markers via any of the methods described in U.S. Pat. No. 7,181,057, to Ghinovker et al., issued Feb. 20, 2007, U.S. Pat. No. 6,779,171, to Baggenstoss, issued Aug. 17, 2004, U.S. Pat. No. 6,778,275 to Bowes, issued Aug. 17, 2004, and/or U.S. Pat. No. 7,463,367, to Bowes, issued Dec. 9, 2008. In additional to calculating offsets, various mathematical models may be applied to interpolate and extrapolate obtained data to generate a geometrical model of the layer overlay.

In some embodiments, acts 310-318 of FIG. 3 may be repeated multiple times to calculate a positional offset between the interest level 210 and the reference level 208 of the wafer 114. In some embodiments, a further set of second registration markers may be applied to a higher interest level 210, and acts 310-318 of FIG. 3 may be repeated to recalibrate wafer alignment. Empirical data as a given batch of wafers is processed may be employed to determine with what frequency, and at which levels it is most useful to perform an overlay determination according to the disclosure.

Additionally, the method 300 may include adjusting future semiconductor fabrication processes on the wafer 114 based on the calculated positional offset. For instance, the registration system 100 may be used to adjust relative wafer and tool positions in future processes such as forming overlying material levels, patterning, etching, etc. based on the calculated positional offset via conventional methods.

The method 300 may, optionally, include demagnetizing the registration markers 202, as shown in act 314 of FIG. 3. For instance, the registration markers 202 may be demagnetized by heating the registration markers 202 past the registration markers' Curie point (i.e., thermal erasure), applying an alternating current (i.e., AC current) through the registration markers 202, permitting self-demagnetization, etc. Demagnetization of the wafer 114 may be desirable so as to not induce artifact into performance of integrated circuitry of semiconductor die locations during pre-singulation testing. Further, if registration markers 202 are located within semiconductor die locations, so as to not induce artifact into the performance of integrated circuitry components of dice singulated from the wafer 114, or into circuitry of other components located in close proximity to such semiconductor dice in higher-level packaging assemblies.

The method 300 for determining an overlay measurement between an interest level and a reference level of a wafer described herein may provide advantages over conventional methods of determining overlay measurements. For example, because the method 300 utilizes magnetic fields emitted by the first set of registration markers within the reference level to determine the locations of the first set of registration markers instead of optical methods, the method 300 is not hindered by opaque materials and/or thick materials overlying the first set of registration markers or reference level, which often hinder conventional optical scanner registration systems. Furthermore, the calculated positional offsets between interest levels and reference levels of wafers are not influenced by surface topography of the wafer, unlike conventional registration systems. Additionally, because detecting the first set of registration markers is not based on optical detection (e.g., limited by image resolutions), the method 300 enables smaller marker sizes in comparison to conventional registration systems. As a result, less of a wafer is required for (e.g., wasted on) registration markers. Moreover, utilizing registration markers may simplify downstream patching requirements and may provide more accurate registration procedures and modeling in comparison to conventional systems. For instance, patching requirements do not need to be considered for open or closed status at any one particular photo level. In particular, substrates disposed over the registration markers may remain closed all the times. Additionally, consideration on how to open an area of wafer or whether the wafer should be opened is unnecessary because determining the registration markers' locations is not impacted by opacity of the substrates disposed over the registration markers. As a result, the substrates disposed over the registration markers may remain un-opened and ma maintain an at least substantially flat topography to alleviate other post processing topography issues that can cause non-uniformities in critical dimension patterns.

Second Set of Embodiments

Figure 10:
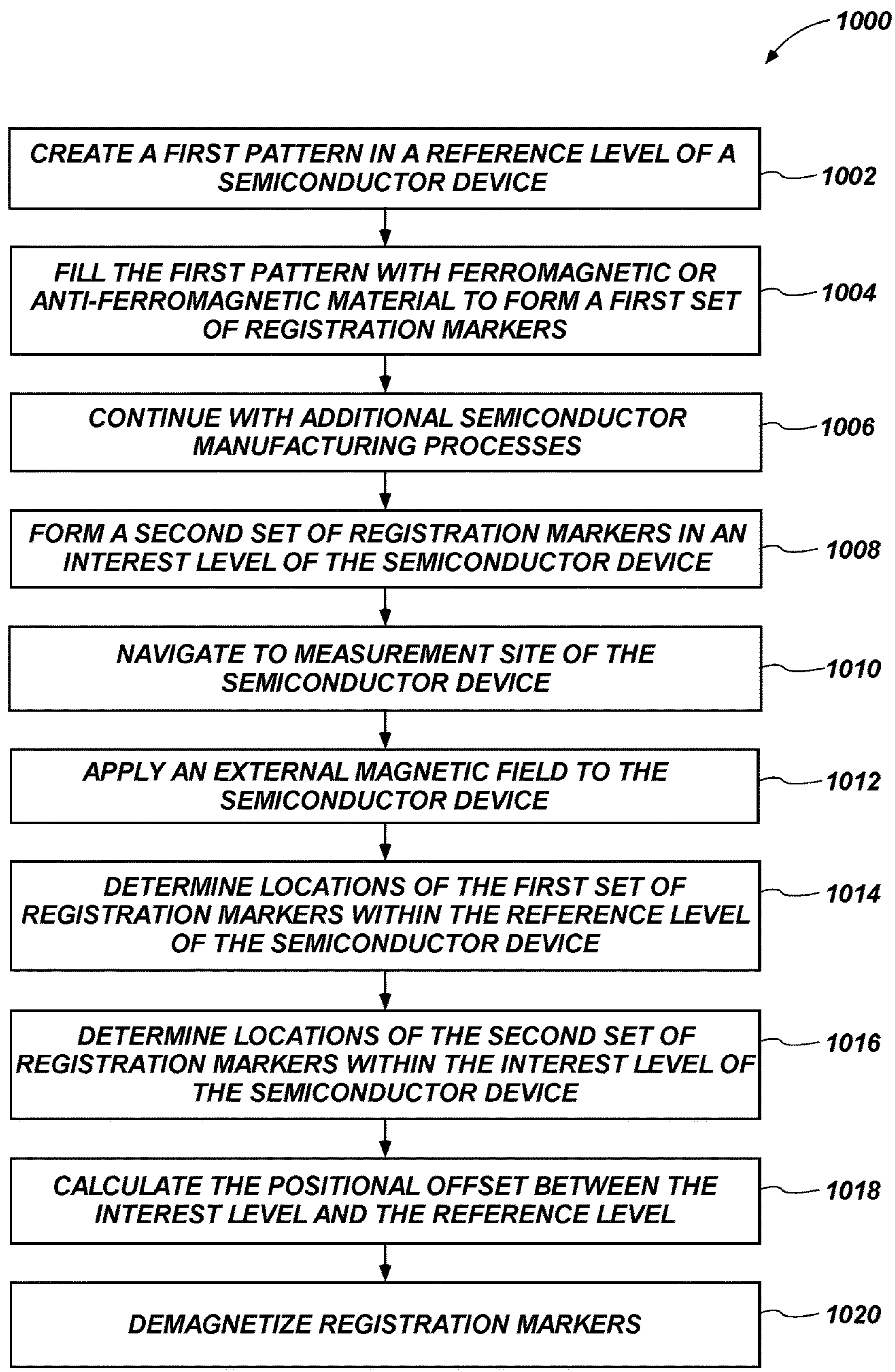
FIG. 10 is a flow diagram of a method for determining an overlay measurement between a reference level and an interest level of a semiconductor device according to one or more embodiments of the present disclosure.

FIG. 10 shows a schematic flow diagram of a method 1000 for determining an overlay measurement between a reference level 208 and an interest level 210 of a wafer 114 according to a second set of embodiments of the present disclosure. As is described in greater detail below, the second set of embodiments may include procedures that involve determining locations of one or more registration markers 202 of the first set of registration markers 202 with the reference level 208 of the wafer 114 based on measuring and/or detecting magnetizations (e.g., magnetization forces) of one or more registration markers 202 of the first set of registration markers 202 within the wafer 114, determining locations of one or more registration markers 203 of the second set of registration markers 203 within the interest level 210 of the wafer 114 at the measurement site via optical methods, and based on the determined locations of the first and second registration markers 202, 203 at the measurement site, calculating a positional offset (e.g., overlay measurement) between the interest level 210 and the reference level 208 of the wafer 114.

As shown in FIG. 10, similar to method 300 discussed above in regard to FIG. 3, the method 1000 includes creating a first pattern 204 (i.e., a reference level pattern) in a surface (e.g., an upper surface) of the reference level 208 of the wafer 114 by removing material from the reference level 208 of the wafer 114, as shown in act 1002. In some embodiments, the first pattern 204 may be created via conventional lithographic processes and methods, as described above.

The method 1000 may also include filling the first pattern 204 with ferromagnetic and/or antiferromagnetic materials or any other material or structure capable of interacting with a magnetic field to form the first set of registration markers 202, as shown in act 1004 of FIG. 10. For instance, act 1004 may include filling recesses of the first pattern 204 with any of the materials described above in regard to FIGS. 2A and 2B. Furthermore, recesses of the first pattern 204 may be filled via conventional methods. In some embodiments, the first set of registration markers 202 within the reference level 208 of the wafer 114 may be formed via any of the methods described above in regard to FIG. 3.

After filling recesses of the first pattern 204 with ferromagnetic and/or antiferromagnetic materials, the registration system 100 and/or other tools may continue with additional semiconductor fabrication processes (e.g., depositing overlying layers, etching processes, etc.) until arriving at an interest level 210 of the wafer 114, as shown in act 1006 of FIG. 10. For example, one or more levels (e.g., the interest level 210 and/or additional overlying layers) may be formed over the reference level 208 and the first set of registration markers 202 of the wafer 114.

Upon arriving at the interest level 210 of the wafer 114, the method 1000 may include forming a second set of registration markers 203 on the interest level 210 of the wafer 114, as shown in act 1008 of FIG. 10. For example, the registration system 100, configured as shown as a photolithography system, may be used to form the second set of registration markers 203 on the interest level 210 of the wafer 114 via any of the methods described in regard to act 308 of FIG. 3.

Referring still to FIG. 10, when initiating an overlay measurement between the reference level 208 and the interest level 210 of the wafer 114, the method 1000 may include navigating to a measurement site, as shown in act 1010 of FIG. 10. For instance, the registration system 100 may navigate the response sensor 132 over the wafer 114 to a location of a registration marker 203 of the second set of registration markers 203 at a desired measurement site. For instance, the registration system 100 may manipulate one or more of the response sensor 132 and the substrate support 112 via the controller 118 via any of the manners described above in regard to FIGS. 1 and 3 to navigate the response sensor 132 to the measurement site of the wafer 114.

Upon navigating the response sensor 132 to the measurement site of the interest level 210 of the wafer 114, the method 1000 may include applying an external magnetic field to the wafer 114, as shown in act 1012 of FIG. 10. In particular, the registration system 100 may apply an external magnetic field to at least one registration marker 202 of the first set of registration markers 202 within the reference level 208 at the measurement site of the wafer 114. In some embodiments, the registration system 100 may apply an external magnetic field to the wafer 114 (e.g., subject the wafer 114 to a magnetic field) via the magnetic source 130 described above in regard to FIG. 1. For example, the registration system 100 may supply a current through a coil of wire wrapped around an iron core to create an external magnetic field. In some embodiments, the registration system 100 may supply a sufficient amount of current to create an external magnetic field having a strength greater than 25 Oe. Moreover, in some embodiments, the magnetic source 130 may be disposed within the response sensor 132 of the registration system 100. For instance, the magnetic source 130 may include an inductor. In one or more embodiments, the registration system 100 may apply external magnetic fields to the wafer 114 on microscales or nanoscales. In some embodiments, applying the external magnetic field to the wafer 114 is optional. For instance, the registration markers 202 may already be magnetized or may be interacting within magnetic fields.

In some embodiments, the registration system 100 may apply an external magnetic field to the wafer 114 to magnetize the at least one registration marker 202 of the first set of registration markers 202 within the wafer 114. Furthermore, in some embodiments, the registration system 100 may drive a magnetization of the at least one registration marker 202 of the first set of registration markers 202. As noted above, applying an external magnetic field to ferromagnetic and/or antiferromagnetic materials may cause the at least one registration marker 202 of the first set of registration markers 202 to maintain a remanence (e.g., remanent magnetization or residual magnetism). Accordingly, as is discussed in greater detail below, in the second set of embodiments, the registration system 100 may drive a magnetization (e.g., drive an AC magnetic force) of the at least one registration marker 202 of the first set of registration markers 202 and may measure a response (e.g., physical force response) based on whether or not magnetized materials (e.g., one or more of the first set of registration markers 202) are present in the wafer 114.

Upon applying an external magnetic field, the method 300 may include determining (e.g., reading) a location of at least one registration marker of 202 the first set of registration markers 202 within the reference level 208 of the wafer 114 at the measurement site, as shown in act 1014 of FIG. 10. In some embodiments, determining the location of the at least one registration marker of 202 the first set of registration markers 202 within the reference level 208 of the wafer 114 may include measuring a magnetization of the at least one registration marker of 202 the first set of registration markers 202. As used herein the term "magnetization" may refer to a density of magnetic dipole moments that are induced in a magnetic material when the magnetic material is placed near a magnet (e.g., the at least one registration marker 202). In one or more embodiments, act 1012 (i.e., the act of applying a magnetic field) may be repeated during and/or between any of the actions taken in act 1014 to maintain and/or drive magnetization of the at least one registration marker of 202 the first set of registration markers 202.

Figure 11:
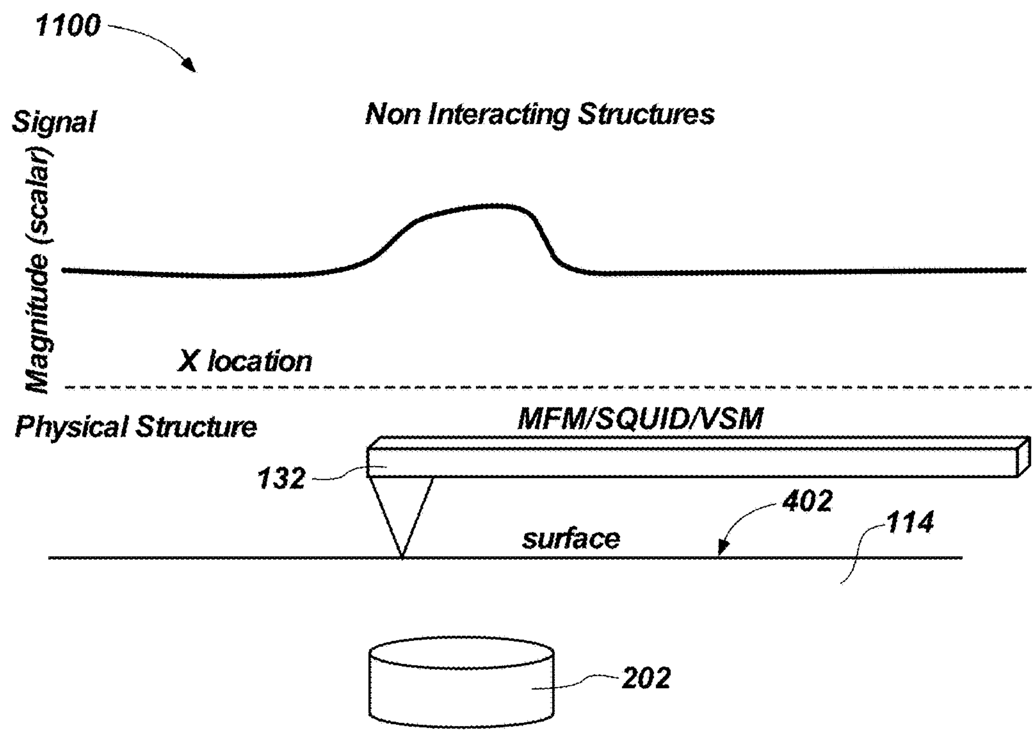
FIG. 11 is a schematic representation of a sensor oriented over a registration marker within a semiconductor device and a scalar magnitude of a measured magnetic field emitted by the registration marker according to one or more embodiments of the present disclosure.
Figure 12:
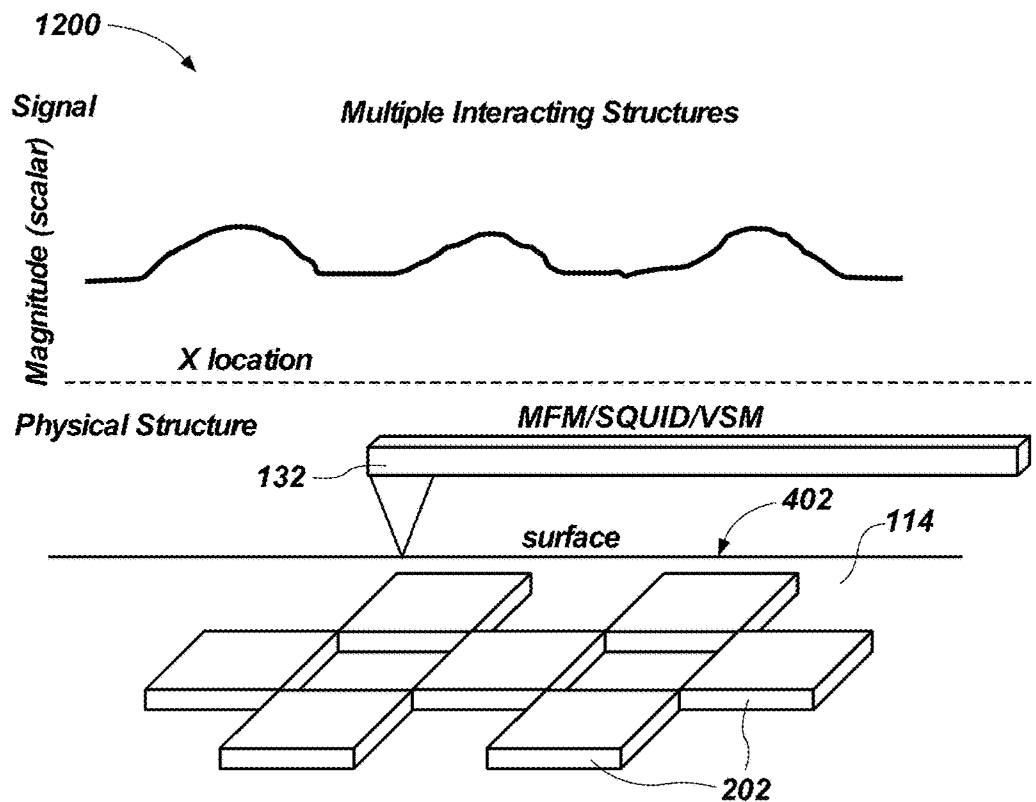
FIG. 12 is a schematic representation of a sensor oriented over a registration marker within a semiconductor device and a scalar magnitude of a measured magnetic field emitted by the registration marker according to one or more embodiments of the present disclosure.

FIGS. 11 and 12 are schematic representations 1100, 1200 of at least one registration marker 202 within a reference level of a wafer 114 and a response sensor 132 of a registration system (e.g., registration system 100) disposed over the wafer 114. Additionally, FIGS. 11 and 12 show example scalar magnitudes of magnetizations of the registration markers 202 detected via the response sensor 132 when passing the response sensor 132 over an upper surface 402 of the wafer 114 and above the at least one registration marker 202 of the first set of registration markers 202 within the wafer 114. As is discussed in greater detail below, utilizing data related to the magnetization of a registration marker 202 to determine a location of the registration marker 202 deems vector data unnecessary within the scope of the second set of embodiments. Referring to act 1016 and FIGS. 10-12 together, the registration system 100 may pass the response sensor 132 over the upper surface 402 of the wafer 114 to detect the a magnetization of the at least one registration marker 202 of the first set of registration markers 202 within the wafer 114. In some embodiments, the registration system 100 may pass the response sensor 132 over the wafer 114 along one or more of the X-axis, Y-axis, and/or Z-axis of the Cartesian space defined above in regard to FIG. 1. For instance, the registration system 100 may pass the response sensor 132 along the X-axis to detect a magnitude of the magnetization of the at least one registration marker 202 of the first set of registration markers 202 along the X-axis of the Cartesian space. As noted above, within the second set of embodiments, the response sensor 132 may include one or more of a MFM probe, SQUID, or VSM.

As a non-limiting example, in embodiments where the response sensor 132 includes an MFM probe, the response sensor 132 may include a sharp magnetized tip for scanning the at least one registration marker 202 of the first set of registration markers 202 within the reference level 208 of the wafer 114. While passing the response sensor 132 over the wafer 114, the registration system 100 may detect interactions between the tip and the at least one registration marker 202 of the first set of registration markers 202 (e.g., deflections of the tip). Furthermore, the registration system 100 may utilize data from the interactions to reconstruct the magnetic structure of the at least one registration marker 202 of the first set of registration markers 202 (e.g., measure magnetization of the at least one registration marker 202 of the first set of registration markers 202). For example, both FIGS. 11 and 12 show measured responses (e.g., measured magnitudes of magnetization) acquired via the registration system 100.

As another non-limiting example, in embodiments where the response sensor 132 includes a VSM, the response sensor 132 may include a driver coil and a search coil, and the process of measuring the magnetization may include vibrating (as is known in the art) the at least one registration marker 202 of the first set of registration markers 202 (e.g., the wafer 114). The driver coil (e.g., a first inductor) may be placed on a first side of at least one registration marker 202 of the first set of registration markers 202, and the search coil (e.g., a second inductor) may be placed on an opposite second side of the at least one registration marker 202 of the first set of registration markers 202 forming a circuit. The driver coil may generate a magnetic field and may induce magnetization in the at least one registration marker 202 of the first set of registration markers 202 (which may be in addition to any magnetization already present). Additionally, the at least one registration marker 202 of the first set of registration markers 202 is vibrated in a sinusoidal motion. A magnetic field is emitted by the at least one registration marker 202 of the first set of registration markers 202 due to the magnetization, and the magnetization of the at least one registration marker 202 of the first set of registration markers 202 may be analyzed as changes occur in relation to the time of the movement (e.g., vibration) of the at least one registration marker 202 of the first set of registration markers 202. For instance, magnetic flux changes induce a voltage in the search coil that are proportional to the magnetization of the registration marker 202. The induced voltage may be measured with a lock-in amplifier using a piezoelectric signal as a frequency reference, as is known in the art. Additionally, as is known in the art, changes in the measured signal (e.g., induced voltage) may be converted to values to determine (e.g., graph) the magnetization of the at least one registration marker 202 of the first set of registration markers 202 versus the magnetic field strength (known in the art as the Hysteresis loop).

In some embodiments, the registration system 100 may pass the response sensor 132 over the upper surface 402 of the wafer 114 along multiple axes (e.g., both the X-axis and the Y-axis) of the Cartesian space to detect a magnetization of the at least one registration marker 202 of the first set of registration markers 202 along the multiple axes at the measurement site of the wafer 114.

Referring still to FIG. 10, based on the data acquired via act 1014 (e.g., scalar representations of the magnetizations of the registration markers 202 along axes of the Cartesian space), the registration system 100 may determine the location of the at least one registration marker 202 of the first set of registration markers 202 in three dimensions (e.g., in the X-axis, Y-axis, and Z-axis) within the reference level 208 of the wafer 114. For instance, as will be understood by one of ordinary skill in the art, the registration system 100 may utilize key features of known data such as, for example, an expected location of the at least one registration marker 202 of the first set of registration markers 202 within an ideal grid relative to key features of measured data such as, for example, the actual measured field vector and magnetization tensor, minimums, maximums, zero crossing values, 1$^{st}$ and higher order derivatives, and maximum derivatives of the detected signals (e.g., magnetizations) to determine a location (e.g., precise location) of the at least one registration marker 202 of the first set of registration markers 202 within the reference level 208 of the wafer 114. As a non-limiting example, if an expected response signal is a sinusoidal response (e.g., FIGS. 11 and 12) or other periodic response, the registration system 100 may utilize the expected response signal and key features of the measured response signal to determine the actual location of the at least one registration marker 202 of the first set of registration markers 202.

As is depicted in FIGS. 10-12, determining locations of the at least one registration marker 202 of the first set of registration markers 202 by measuring magnetization of the at least one registration marker 202 of the first set of registration markers 202 may enable the registration system 100 to determine a location of the at least one registration marker 202 of the first set of registration markers 202 that may have magnetic fields that are interacting with each other. Accordingly, by measuring magnetization of the at least one registration marker 202 of the first set of registration markers 202, the registration system 100 may allow for other registration markers to be in close proximity and to have interacting magnetic fields with the at least one registration marker 202 of the first set of registration markers 202 while locating the at least one registration marker 202.

In addition to determining a location of the at least one registration marker 202 of the first set of registration markers 202 within the reference level 208 of the wafer 114 at the measurement site, the method 1000 may include determining a location of at least one registration marker 203 of the second set of registration markers 203 on the interest level 210 of the wafer 114 at the measurement site, as shown in act 1016 of FIG. 10. For instance, the registration system 100 may detect the at least one registration marker 203 of the second set of registration markers 203 on the interest level 210 of the wafer 114 at the measurement site via any of the methods described above in regard to act 316 of FIG. 3.

Upon determining the locations of the at least one registration marker 202 of the first set of registration markers 202 and the at least one registration marker 203 of the second set of registration markers 203 at the measurement site, the method 1000 may include calculating a positional offset between the interest level 210 and the reference level 208 of the wafer 114, as shown in act 1018 of FIG. 3. For instance, based on the locations of the at least one registration marker 202 of the first set of registration markers 202 within the reference level 208 and the at least one registration marker 203 of the second set of registration markers 203 within the interest level 210, the registration system 100 may calculate the positional offset (e.g., overlay measurement) via any of the methods described above in regard to act 318 of FIG. 3.

Additionally, the method 1000 may include adjusting future semiconductor fabrication processes on the wafer 114 or other products based on the calculated positional offset. For instance, overlay data generated by the registration system 100 may be used in operating processing tools to adjust future processes such as forming and patterning overlying materials, etching processes, etc. based on the calculated positional offset via conventional methods.

The method 1000 may, optionally, include demagnetizing the registration markers, as shown in act 1020 via any of the manners described above in regard to act 320 of FIG. 3.

The method 1000 for aligning a wafer described herein may provide any of the advantages described in regard to FIGS. 3-9. Furthermore, because method 1000 functions by detecting and/or measuring the magnetization of the first set of registration markers 202 instead of the magnetic fields, the method 1000 does not depend on orientations of the magnetic moment of the first set of registration markers 202. For example, method 1000 permits arbitrary, while originally known, shapes and placements of the first set of registration markers 202 within the wafer 114. Accordingly, method 1000 may be advantageous when shapes and/or orientations of the first set of registration markers 202 are unknown and/or when orienting domains of the first set of registration markers 202 is proving difficult.

Third Set of Embodiments

Figure 13:
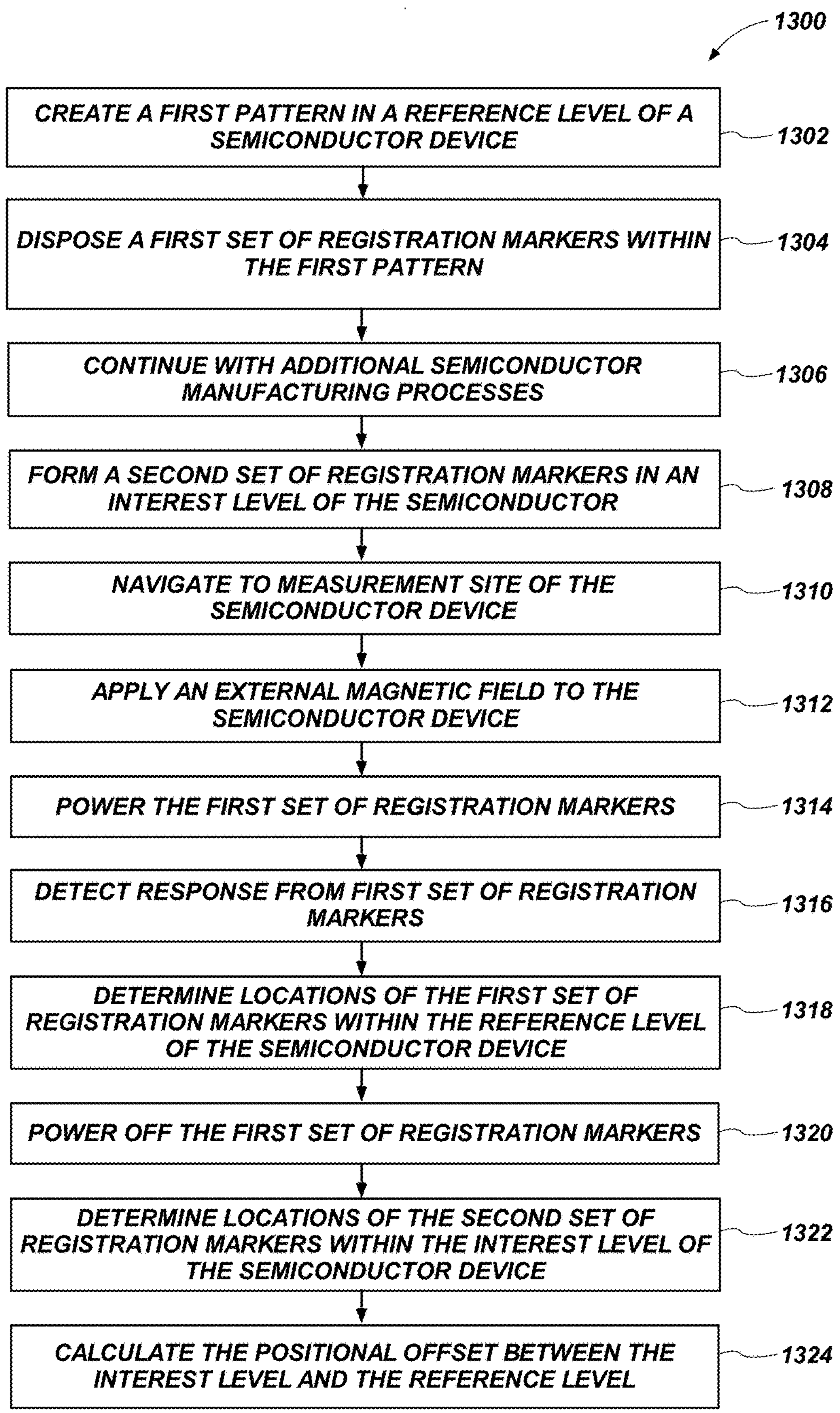
FIG. 13 is a flow diagram of a method for determining an overlay measurement between a reference level and an interest level of a semiconductor device according to one or more embodiments of the present disclosure.

FIG. 13 shows a schematic flow diagram of a method for determining an overlay measurement between a reference level 208 and an interest level 210 of a wafer 114 according to a third set of embodiments of the present disclosure. As is described in greater detail below, the third set of embodiments may include procedures that involve determining a location of at least one first registration marker 202 of the first set of registration markers 202 within the reference level 208 of the wafer 114 at a measurement site by powering the at least one first registration marker with a magnetic field and measuring and/or detecting responses (e.g., signals, feedback, and/or magnetic fields) from the at least one first registration marker 202, determining locations of one or more registration markers 203 of the second set of registration markers 203 within the interest level 210 of the wafer 114 at the measurement site via optical methods, and based on the determined locations of the first and second registration markers 202, 203 at the measurement site, calculating a positional offset (e.g., overlay measurement) between the interest level 210 and the reference level 208 of the wafer 114.

As shown in FIG. 13, similar to method 300 discussed above in regard to FIG. 3, the method 1300 includes creating a first pattern 204 of recesses (i.e., a reference level pattern) in a surface (e.g., an upper surface) of the reference level 208 of the wafer 114 by removing material from the reference level 208 of the wafer 114, as shown in act 1302. In some embodiments, recesses of the first pattern 204 via conventional lithographic processes and methods. For example, the first pattern 204 of recesses may be formed via any of the methods described in regard to act 302 of FIG. 3.

As shown in FIG. 13, the method 1300 may further include disposing a first set of registration markers 202 within recesses of the first pattern 204 of the reference level 208 of the wafer 114, as shown in act 1304 of FIG. 13. Furthermore, in the embodiment of FIG. 13, each registration marker 202 of the first set of registration markers 202 may include a circuit configured to be powered via induction. For instance, each registration marker 202 of the first set of registration markers 202 may include a receiving inductor for powering the circuit. Additionally, each registration marker of first set of registration markers may include microcircuitry or nanocircuitry or an inductively powerable MEMS device operatively coupled to induction-driven power circuitry.

In one or more embodiments, each registration marker of the first set of registration markers 202 may include an antenna. For example, each registration marker 202 of the first set of registration markers 202 may include any conventional micro-antennae or nano-antennae. In additional embodiments, each registration marker 202 of the first set of registration markers 202 may include components for producing AC magnetic fields. For instance, each registration marker of first set of registration markers may include one or more solenoids or coils for producing AC magnetic fields. Additionally, each registration marker of the first set of registration markers may be capable of emitting electromagnetic fields, acoustic vibrations, thermal emissions, and/or other responses (vector or scalar). In some embodiments, the first set of registration markers 202 may include an array of antennae that may utilize beam shaping and/or other methods to control a directionality of radiation from the array of antennae. Additionally, the first set of registration markers 202 may drive a ferromagnetic core of flux channel that emits an AC magnetic field.

After the first set of registration markers 202 is disposed within the first pattern 204 within the reference level 208 of the wafer 114, additional semiconductor fabrication processes (e.g., depositing overlying materials, etching processes, etc.) may be effected until arriving at an interest level 210 of the wafer 114, as shown in act 1306 of FIG. 310 For example, one or more substrates (e.g., the interest level 210 and/or other overlying layers) may be formed over the reference level 208 and the first set of registration markers of the wafer 114.

Upon arriving at the interest level 210 of the wafer 114, the method 1300 may include forming a second set of registration markers 203 on the interest level 210 of the wafer 114, as shown in act 1308 of FIG. 10. For example, the registration system 100 may be used to form the second set of registration markers 203 on the interest level 210 of the wafer 114 via any of the methods described in regard to act 308 of FIG. 3.

Referring still to FIG. 13, when initiating an overlay measurement between the reference level 208 and the interest level 210 of the wafer 114, the method 1300 may include navigating to a measurement site, as shown in act 1310 of FIG. 10. For instance, the registration system 100 may navigate the response sensor 132 over the wafer 114 to a location of a registration marker 203 of the second set of registration markers 203 at a desired measurement site. For instance, the registration system 100 may manipulate one or more of the response sensor 132 and the substrate support 112 via the controller 118 via any of the manners described above in regard to FIGS. 1 and 3 to navigate the response sensor 132 to the measurement site of the wafer 114.

Upon navigating the response sensor 132 to the measurement site of the interest level 210 of the wafer 114, the method 1300 may include applying an external magnetic field to the wafer 114, as shown in act 1312 of FIG. 10. In one or more embodiments, the registration system 100 may apply the external magnetic field to an entirety of the wafer 114. In additional embodiments, the registration system 100 may apply the external magnetic field to only regions of the wafer 114 (e.g., the measurement site of the wafer 114). For instance, in some embodiments, the magnetic source 130 may be disposed within the response sensor 132. As a non-limiting example, the magnetic source 130 may include a voltage source and an inductor. The voltage source may by coupled to the inductor (via traces, wires, etc.) to cause a voltage across the inductor, and as a result, cause the inductor to emit an external magnetic field around the inductor. In some embodiments, applying the external magnetic field to the wafer 114 is optional. For instance, the registration markers 202 may already be magnetized or may be interacting within magnetic fields.

In response to applying an external magnetic field to the wafer 114, method 1300 may include powering at least one registration marker of the first set of registration markers 202 (e.g., at least one circuit) within the wafer 114 at the measurement site, as shown in act 1314 of FIG. 13. For instance, the inductor of the at least one registration marker 202 of the first set of registration markers 202 may create a voltage across the inductor in response to the applied external magnetic field, and the voltage may power the circuit of the at least one registration marker 202. Powering the at least one registration marker 202 of the first set of registration markers 202 may cause a signal to be emitted by antenna of the at least one registration marker of the first set of registration markers, AC magnetic fields to be emitted by a coil of the at least one registration marker of the first set of registration markers, electromagnetic fields to be emitted by a coil of the at least one registration marker of the first set of registration markers, acoustic vibrations to be emitted by the at least one registration marker of the first set of registration markers, thermal emissions to be emitted by the at least one registration marker, or other responses (vector or scalar) emitted by the at least one registration marker of the first set of registration markers 202 and detectable by the response sensor 132.

Additionally, the method 1300 may include detecting and/or measuring the responses using response sensor 132 from at least one registration marker 202 of the first set of registration markers 202, as shown in act 1316 of FIG. 13. For instance, in some embodiments, detecting and/or measuring the response from the at least one registration marker 202 of the first set of registration markers 202 may include detecting a magnetic field emitted by the at least one registration marker 202 of the first set of registration markers 202 via any of the manners described above in regard to FIGS. 1-12. In additional embodiments, detecting and/or measuring the response from the at least one registration marker 202 of the first set of registration markers 202 may include receiving signals (e.g., radiofrequency signals, electromagnetic emissions, etc.) from antenna of the at least one registration marker of the first set of registration markers. In further embodiments, wherein registration markers are configured as MEMS devices, vibrations may be initiated responsive to inductive power, and such vibrations, the magnitude, frequency and waveform thereof, may be detected and measured by response sensor 132.

Furthermore, based on the detected and/or measured responses from the at least one registration marker 202 of the first set of registration markers 202, the method 1300 may include determining a location of the at least one registration marker 202 of the first set of registration markers 202 within the reference level 208 of the wafer 114, as shown in act 1318 of FIG. 13. In some embodiments, determining locations of the at least one registration marker of the first set of registration markers within the reference level 208 of the wafer 114 may include determining a location of the response sensor 132 over the wafer 114 relative to a remainder of the wafer 114. For instance, in operation and use, the magnetic source 130 may power a circuit within the at least one registration marker 202 of the first set of registration markers 202 within the wafer 114, and based on the magnitude, location, orientation, etc. of a response from the circuit, the registration system 100 can determine where the registration marker 202 is located in the wafer 114.

Moreover, the method 1300 may include powering off the at least one registration marker 202 of the first set of registration markers 202 via conventional methods, as shown in act 1320 of FIG. 13. Powering off of a registration marker 202 of the embodiment may comprise merely terminating generation of a magnetic field employed as a power source.

In addition to determining a location of the at least one registration marker 202 of the first set of registration markers 202 within the reference level 208 of the wafer 114 at the measurement site, the method 1300 may include determining a location of at least one registration marker 203 of the second set of registration markers 203 on the interest level 210 of the wafer 114 at the measurement site, as shown in act 1322 of FIG. 10. For instance, the registration system 100 may detect the at least one registration marker 203 of the second set of registration markers 203 on the interest level 210 of the wafer 114 at the measurement site via any of the methods described above in regard to act 316 of FIG. 3.

Upon determining the locations of the at least one registration marker 202 of the first set of registration markers 202 and the at least one registration marker 203 of the second set of registration markers 203 at the measurement site, the method 1300 may include calculating a positional offset between the interest level 210 and the reference level 208 of the wafer 114, as shown in act 1324 of FIG. 3. For instance, based on the respective locations of the at least one registration marker 202 of the first set of registration markers 202 within the reference level 208 and the at least one registration marker 203 of the second set of registration markers 203 within the interest level 210, the registration system 100 may calculate the positional offset (e.g., overlay measurement) via any of the methods described above in regard to act 318 of FIG. 3.

Additionally, the method 1300 may include adjusting future semiconductor fabrication processes on the wafer 114 based on the calculated positional offset. For instance, overlay data from the registration system 100 may be used to by semiconductor processing tools to adjust future processes such as forming and patterning overlying materials, etching processes, etc. based on the calculated positional offset via conventional methods.

Figure 14:
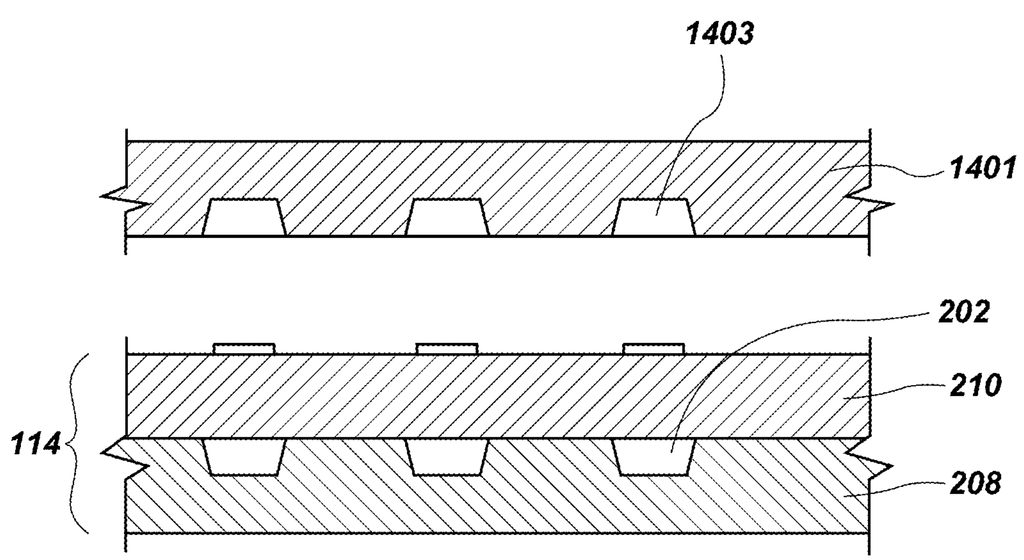
FIG. 14 is a schematic view of a sensor head of a registration system according to one or more embodiments of the present disclosure.

FIG. 14 is a schematic representation of a sensor head 1401 that may be utilized with the methods described in regard to FIG. 13. In some embodiments, as described above, the wafer 114 may include an array of registration markers 202 within the wafer 114. Furthermore, the sensor head 1401 may include a complimentary set of markers 1403. For instance, the sensor head 1401 may include an inductive bridge circuit that may amplify small differences in coupling between two inductor pairs (e.g., correlating markers between the array of registration markers 202 and the set of markers 1403 of the sensor head 1401). Additionally, the sensor head 1401 may be utilized via any of the manners described above in regard to FIG. 13.

Referring to FIGS. 1-14 together, additional embodiments of the present disclosure may include metal detector technologies for locating non-magnetized registration markers, placing the registration markers within die, and unique registration marker designs with fewer design constraints than conventional, only visually detectable registration markers.

One or more embodiments of the present disclosure include a method of determining an overlay measurement (e.g., a positional offset) between an interest level of a wafer and a reference level of the wafer. The method may include applying a magnetic field to a wafer, detecting at least one residual magnetic field emitted from at least one registration marker of a first set of registration markers within the wafer, responsive to the detected at least one residual magnetic fields, determining a location of the at least one registration marker of the first set registration markers, determining a location of at least one registration marker of a second set of registration markers, and responsive to the determined locations of the at least one registration marker of the first set of registration markers and the at least one registration marker of the second set of registration markers, calculating a positional offset between an interest level of the wafer and a reference level of the wafer.

Some embodiments of the present disclosure include a method of determining an overlay measurement (e.g., a positional offset) between an interest level of a wafer and a reference level of the wafer. The method may include driving a magnetization of at least one registration marker of a first set of registration markers within a reference level of a wafer, measuring the magnetization of the at least one registration marker of the first set of registration markers, responsive to the measured magnetization of the at least one registration marker of the first set of registration markers, determining a location of the at least one registration marker of the first set of registration markers, determining a location of at least one registration marker of a second set of registration markers on an interest level of the wafer, and responsive to the determined locations of the at least one registration marker of the first set of registration markers and the at least one registration marker of the second set of registration markers, calculating a positional offset between the interest level of the wafer and the reference level of the wafer.

One or more embodiments of the present disclosure include a method of determining an overlay measurement (e.g., a positional offset) between an interest level of a wafer and a reference level of the wafer. The method may include applying a magnetic field to a wafer having a first set of registration markers disposed within a reference level of the wafer and comprising a ferromagnetic or antiferromagnetic material or any other material or structure capable of interacting with a magnetic field, detecting one or more magnetic attributes of at least one registration marker of the first set of registration markers with a response sensor, responsive to the detected one or more magnetic attributes, determining a location of the at least one registration marker of the first set of registration markers, determining a location of at least one registration marker of a second set of registration markers on an interest level of the wafer, and responsive to the determined locations of the at least one registration marker of a first set of registration markers and the at least one registration marker of the second set of registration markers, calculating a positional offset between the interest level of the wafer and the reference level of the wafer.

Further embodiments of the present disclosure include a registration system comprising a substrate support for supporting a wafer, an optical microscope imaging or scatterometry system configured to recognize at least locations of visible elements on a wafer, a sensor movable over the wafer and configured to detect magnetic attributes of registration markers within the wafer and a controller operably coupled to the substrate support, the sensor and the optical microscope imaging or scatterometry system. The controller comprises at least one processor and at least one non-transitory computer-readable storage medium storing instructions thereon that, when executed by the at least one processor, cause the controller to: receive data related to detected magnetic attributes of the registration markers from the sensor; responsive to the received data related to detected magnetic attributes, determine at least locations of the registration markers within the wafer; receive date related to recognized at least locations of visible elements on a wafer; responsive to the received data related to recognized at least locations of visible elements, determine at least locations of the visible elements on the wafer; and responsive to a determined at least locations of at least one registration marker and at least one visible element, calculate a positional offset between the at least one registration marker and the at least one visible element.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternate useful combinations of the elements described, will become apparent to those skilled in the art from the description. Such modifications and embodiments also fall within the scope of the appended claims and equivalents.

What is claimed is:

1. A method, comprising:

applying a magnetic field to a wafer;

detecting at least one residual magnetic field emitted from at least one registration marker of a first set of registration markers within the wafer;

responsive to the detected at least one residual magnetic fields, determining a location of the at least one registration marker of the first set of registration markers;

determining a location of at least one registration marker of a second set of registration markers; and responsive to respective determined locations of the at least one registration marker of the first set of registration markers and the at least one registration marker of the second set of registration markers, calculating a positional offset between an interest level of the wafer and a reference level of the wafer.

2. The method of claim 1, wherein determining a location of at least one registration marker of a second set of registration markers comprise optically determining the location of the at least one registration marker of the second set of registration markers.

3. The method of claim 1, further comprising:

forming a first pattern of recesses of a surface of the wafer at a reference level; and filling recesses of the first pattern with a ferromagnetic or antiferromagnetic material to form the first set of registration markers.

4. The method of claim 3, wherein forming a first pattern of recesses in the reference level of the wafer comprises forming the first pattern with each registration marker of the first set of registration markers having longitudinal ends aligned along one of an X-axis, a Y-axis, or a Z-axis of a Cartesian space.

5. The method of claim 1, wherein detecting the at least one residual magnetic field emitted from the at least one registration marker of the first set of registration markers within the wafer comprises detecting the at least one residual magnetic field with a sensor selected from the group consisting of a Hall Effect sensor, a GMR sensor, a TMR sensor, an EMR sensor, or a spin hall sensor.

6. The method of claim 1, wherein applying a magnetic field to the wafer comprises applying an in plane magnetic field to the wafer.

7. The method of claim 1, wherein applying a magnetic field to the wafer comprises applying an out of plane magnetic field to the wafer.

8. The method of claim 1, wherein applying a magnetic field to the wafer comprises rotating all domains within the at least one registration marker of the first set of registration markers to be in known directions.

9. The method of claim 1, further comprising forming the second set of registration markers on a surface of the interest level of the wafer.

10. The method of claim 1, further comprising navigating a response sensor to a measurement site of the wafer prior to detecting the at least one residual magnetic field emitted from the at least one registration marker of the first set of registration markers.

11. The method of claim 1, further comprising forming the interest level of the wafer to overlie the reference level of the wafer after forming the first set of registration markers.

12. A method, comprising:

driving a magnetization of at least one registration marker of a first set of registration markers within a reference level of a wafer;

measuring the magnetization of the at least one registration marker of the first set of registration markers;

responsive to the measured magnetization of the at least one registration marker of the first set of registration markers, determining a location of the at least one registration marker of the first set of registration markers;

determining a location of at least one registration marker of a second set of registration markers on an interest level of the wafer; and responsive to the determined locations of the at least one registration marker of the first set of registration markers and the at least one registration marker of the second set of registration markers, calculating a positional offset between the interest level of the wafer and the reference level of the wafer within a plane at least substantially parallel to a major surface of the wafer, wherein measuring the magnetization of the at least one registration marker of the first set of registration markers within the reference level of the wafer comprises measuring the magnetization with a sensor selected from a group consisting of a MFM probe, a SQUID, or VSM.

13. The method of claim 12, further comprising adjusting a semiconductor fabrication process based on the calculated positional offset between the interest level of the wafer and the reference level of the wafer.

14. The method of claim 12, wherein determining a location of at least one registration marker of a second set of registration markers comprise optically determining the location of the at least one registration marker of the second set of registration markers.

15. The method of claim 12, wherein measuring the magnetization of the at least one registration marker of the first set of registration markers comprises:

passing a response sensor over a surface of the wafer at a measurement site;

detecting interactions between a magnetized tip of the response sensor and the at least one registration marker of the first set of registration markers; and responsive to the detected interactions, determining the magnetization of the at least one registration marker of the first set of registration markers.

16. A method, comprising:

applying a magnetic field to a wafer having a first set of registration markers disposed within a reference level of the wafer and comprising a ferromagnetic or antiferromagnetic material;

detecting a residual magnetic field of at least one registration marker of the first set of registration markers with a response sensor;

responsive to the detected residual magnetic field, determining a location of the at least one registration marker of the first set of registration markers;

determining a location of at least one registration marker of a second set of registration markers on an interest level of the wafer; and responsive to the respective determined locations of the at least one registration marker of a first set of registration markers and the at least one registration marker of the second set of registration markers, calculating a positional offset between the interest level of the wafer and the reference level of the wafer within a plane at least substantially parallel to a major surface of the wafer.

17. The method of claim 16, further comprising measuring a magnetization of the at least one registration marker of the first set of registration markers.

18. The method of claim 16, further comprising approximating a residual magnetic field of the at least one registration marker of the first set of registration markers as a dipole.

19. A method, comprising:

applying a magnetic field to a wafer;

detecting a response from at least one registration marker of a first set of registration markers within the wafer;

responsive to the detected response, determining a location of the at least one registration marker of the first set of registration markers;

determining a location of at least one registration marker of a second set of registration markers; and responsive to respective determined locations of the at least one registration marker of the first set of registration markers and the at least one registration marker of the second set of registration markers, calculating a positional offset between an interest level of the wafer and a reference level of the wafer within a plane at least substantially parallel to a major surface of the wafer, wherein detecting the response from the at least one registration marker of the first set of registration markers within the wafer comprises detecting the response with a sensor selected from a group consisting of a MFM probe, a SQUID, or VSM.

20. The method of claim 19, wherein detecting a response from at least one registration marker of a first set of registration markers within the wafer comprises detecting photon emissions from the at least one registration marker of a first set of registration markers.

21. The method of claim 19, wherein detecting a response from at least one registration marker of a first set of registration markers within the wafer comprises detecting a DC magnetic field emitted by the at least one registration marker of a first set of registration markers.

22. The method of claim 19, further comprising disposing the at least one registration marker of a first set of registration markers within recesses of a pattern within the wafer, the at least one registration marker comprising one or more circuits.

* * * * *